(12) United States Patent
Sekine et al.

(10) Patent No.: US 9,704,793 B2
(45) Date of Patent: Jul. 11, 2017

(54) SUBSTRATE FOR ELECTRONIC DEVICE AND ELECTRONIC DEVICE

(75) Inventors: Shigenobu Sekine, Tokyo (JP); Yurina Sekine, Tokyo (JP)

(73) Assignee: NAPRA CO., LTD., Tokyo (JP)

( * ) Notice: Subject to any disclaimer, the term of this patent is extended or adjusted under 35 U.S.C. 154(b) by 156 days.

(21) Appl. No.: 13/313,823

(22) Filed: Dec. 7, 2011

(65) Prior Publication Data

US 2012/0168206 A1    Jul. 5, 2012

(30) Foreign Application Priority Data

| Jan. 4, 2011 | (JP) | 2011-000241 |
| Jan. 18, 2011 | (JP) | 2011-007519 |
| Jan. 27, 2011 | (JP) | 2011-015280 |
| Feb. 21, 2011 | (JP) | 2011-034205 |
| Mar. 16, 2011 | (JP) | 2011-057542 |
| Apr. 19, 2011 | (JP) | 2011-092717 |
| May 26, 2011 | (JP) | 2011-118077 |

(51) Int. Cl.

| H05K 1/03 | (2006.01) |
| H01L 23/498 | (2006.01) |
| H01L 21/48 | (2006.01) |
| H01L 23/367 | (2006.01) |
| H01L 33/64 | (2010.01) |
| H01L 33/48 | (2010.01) |

(52) U.S. Cl.
CPC ...... *H01L 23/49827* (2013.01); *H01L 21/486* (2013.01); *H01L 23/3677* (2013.01); *H01L 33/642* (2013.01); *H01L 33/486* (2013.01); *H01L 2224/16225* (2013.01); *H01L 2224/48472* (2013.01); *H01L 2924/01327* (2013.01); *H01L 2924/09701* (2013.01); *H01L 2924/12044* (2013.01); *H01L 2924/181* (2013.01); *H01L 2933/0066* (2013.01)

(58) Field of Classification Search
CPC ............ H01L 2924/01079; H01L 2924/01078
USPC .................................................. 174/260–266
See application file for complete search history.

(56) References Cited

U.S. PATENT DOCUMENTS

| 7,300,860 B2 * | 11/2007 | Dubin .................... B82Y 10/00 |
| | | 257/774 |
| 7,462,890 B1 * | 12/2008 | Tombler, Jr. ........... B82Y 10/00 |
| | | 257/192 |
| 2003/0127965 A1 | 7/2003 | Uemura et al. |
| 2005/0142933 A1 | 6/2005 | Beer et al. |

(Continued)

FOREIGN PATENT DOCUMENTS

| CN | 1249774 C | 4/2006 |
| CN | 101400218 A | 4/2009 |

(Continued)

OTHER PUBLICATIONS

EP 0349269 B1; Flexible copper-clad substrates, Inventor : Shiro, Publication date: Jun. 15, 1994.*

(Continued)

*Primary Examiner* — Pete Lee
(74) *Attorney, Agent, or Firm* — Westerman, Hattori, Daniels & Adrian, LLP

(57) ABSTRACT

A substrate includes a plurality of through electrodes. The through electrode has a nanocomposite structure including a nm-sized carbon nanotube and is a casting formed by using a via formed in the substrate as a mold.

5 Claims, 29 Drawing Sheets

(56) References Cited

U.S. PATENT DOCUMENTS

| | | | |
|---|---|---|---|
| 2007/0007540 A1 | 1/2007 | Hashimoto et al. | |
| 2007/0018190 A1* | 1/2007 | Kim et al. | 257/99 |
| 2007/0108461 A1 | 5/2007 | Shiraishi et al. | |
| 2007/0228361 A1 | 10/2007 | Raravikar et al. | |
| 2007/0235847 A1 | 10/2007 | Ramanathan et al. | |
| 2007/0284994 A1 | 12/2007 | Morimoto et al. | |
| 2008/0092378 A1 | 4/2008 | Chujo et al. | |
| 2008/0251287 A1 | 10/2008 | Shiraishi et al. | |
| 2009/0045512 A1 | 2/2009 | Hedler et al. | |
| 2009/0081867 A1 | 3/2009 | Taguchi et al. | |
| 2009/0083975 A1* | 4/2009 | Lee et al. | 29/830 |
| 2009/0084588 A1 | 4/2009 | Sekine et al. | |
| 2009/0152742 A1 | 6/2009 | Ikeguchi et al. | |
| 2009/0294966 A1* | 12/2009 | Liu | H01L 21/288 257/746 |
| 2009/0301767 A1* | 12/2009 | Mok et al. | 174/255 |
| 2010/0044074 A1* | 2/2010 | Kim | B82Y 10/00 174/126.2 |
| 2010/0051881 A1* | 3/2010 | Ahn et al. | 252/513 |
| 2010/0207218 A1 | 8/2010 | Taguchi et al. | |
| 2010/0246135 A1 | 9/2010 | Hongo et al. | |
| 2010/0301485 A1 | 12/2010 | Sekine et al. | |
| 2011/0120759 A1 | 5/2011 | Sekine et al. | |
| 2011/0140281 A1 | 6/2011 | Sekine et al. | |
| 2011/0141704 A1 | 6/2011 | Sekine et al. | |

FOREIGN PATENT DOCUMENTS

| | | |
|---|---|---|
| CN | 101908523 A | 12/2010 |
| EP | 2 267 799 A1 | 12/2010 |
| JP | 63-192547 A | 8/1988 |
| JP | 02-224862 A | 9/1990 |
| JP | 05-277697 A | 10/1993 |
| JP | 10-098127 A | 4/1998 |
| JP | 10-189814 A | 7/1998 |
| JP | 11-298138 A | 10/1999 |
| JP | 2000-117411 A | 4/2000 |
| JP | 2000-228410 A | 8/2000 |
| JP | 2002-158191 A | 5/2002 |
| JP | 2002-244152 A | 8/2002 |
| JP | 2003-243790 A | 8/2003 |
| JP | 2003-257891 A | 9/2003 |
| JP | 2003-347485 A | 12/2003 |
| JP | 2004-010978 A | 1/2004 |
| JP | 2004-067485 A | 3/2004 |
| JP | 2004-160549 A | 6/2004 |
| JP | 2004-228200 A | 8/2004 |
| JP | 2004-281977 A | 10/2004 |
| JP | 2005-501413 A | 1/2005 |
| JP | 2005-109133 A | 4/2005 |
| JP | 2005-158957 A | 6/2005 |
| JP | 2005-277096 A | 10/2005 |
| JP | 2006-66412 A | 3/2006 |
| JP | 2006-111896 A | 4/2006 |
| JP | 2006-144030 A | 6/2006 |
| JP | 2006-147971 A | 6/2006 |
| JP | 2006-174677 A | 6/2006 |
| JP | 2006-203170 A | 8/2006 |
| JP | 2007-123516 A | 5/2007 |
| JP | 2007-134645 A | 5/2007 |
| JP | 2007-194630 A | 8/2007 |
| JP | 2007-294834 A | 11/2007 |
| JP | 2007-318050 A | 12/2007 |
| JP | 2008-4777 A | 1/2008 |
| JP | 2008-004853 A | 1/2008 |
| JP | 2008-113039 A | 5/2008 |
| JP | 2008-155489 A | 7/2008 |
| JP | 2008-258322 A | 10/2008 |
| JP | 2008-293821 A | 12/2008 |
| JP | 2008-294253 A | 12/2008 |
| JP | 2009-044065 A | 2/2009 |
| JP | 2009-076752 A | 4/2009 |
| JP | 2009-076882 A | 4/2009 |
| JP | 2009-111006 A | 5/2009 |
| JP | 2009-117489 A | 5/2009 |
| JP | 2009-152535 A | 7/2009 |
| JP | 2009-164152 A | 7/2009 |
| JP | 2009-238957 A | 10/2009 |
| JP | 2010-034254 A | 2/2010 |
| JP | 2010-129992 A | 6/2010 |
| JP | 2010-129995 A | 6/2010 |
| JP | 4472023 B1 | 6/2010 |
| JP | 4505545 B1 | 7/2010 |
| JP | 2010-192696 A | 9/2010 |
| JP | 2010-238941 A | 10/2010 |
| WO | 2009/137286 A1 | 11/2009 |

OTHER PUBLICATIONS

Japanese Office Action dated Jul. 3, 2013, issued in Japanese application No. 2011-223050, divisional of JP2011-000241.

Japanese Office Action dated Oct. 30, 2013, in corresponding to Japanese Application No. 2011-223050.

Japanese Office Action dated Nov. 21, 2012, issued in corresponding Japanese Patent Application No. 2011-34205 (2 pages).

Japanese Office Action dated Aug. 22, 2012, issued in corresponding Japanese Patent Application No. 2012-029703, with English translation (pp. 7).

Japanese Office Action dated Mar. 7, 2012, issued in corresponding Japanese Patent Application No. 2011-034205.

Extended Euroopean Search Report dated Jan. 16, 2013, issued in corresponding European Patent Application No. 11275161.5 (6 pages).

Japanese Office Action dated Dec. 10, 2014, issued in counterpart Japanese Patent Application No. 2011-223050 (16 pages).

Chinese Office Action dated Aug. 23, 2016, issued in Chinese Patent Application No. 2016081801573430 (9 pages).

Office Action dated Jun. 23, 2015, issued in counterpart Chinese Patent Application No. 201210001136.5 (12 pages).

* cited by examiner

SUBSTRATE FOR ELECTRONIC DEVICE AND ELECTRONIC DEVICE

BACKGROUND OF THE INVENTION

1. Field of the Invention

The present invention relates to a substrate for an electronic device and an electronic device.

2. Description of the Related Art

In electronic devices such as various scales of integrated circuits, various types of semiconductor elements and chips thereof, for example, there has been employed a method of disposing an element on a substrate and connecting them by means of wire bonding or the like. However, this method not only requires the process of wire bonding but also increases the mounting area with the number of elements, so that the signal delay increases because of an increase in wiring length.

Therefore, there has been proposed a TSV (through-silicon-via) technology of providing a substrate with through-electrodes and replacing the conventional wire bonding with the through-electrodes. Japanese Unexamined Patent Application Publication Nos. 11-298138, 2000-228410, 2002-158191 and 2003-257891 disclose a through electrode formation technology essential for the TSV technology. The superiority of the TSV technology over the wire bonding is as follows.

At first, the number of connections is limited to 100 to 200 in the wire bonding, but the use of the TSV technology makes it possible to arrange connecting through electrodes at intervals of the order of μm, increasing the number of connections to several thousand.

In addition, there can be obtained advantages as follows: since connection distance can be minimized, it is less likely to be affected by noise; since parasitic capacitance and resistance are low, it is possible to reduce delay, attenuation, or waveform degradation; an additional circuit is not required for amplification or electrostatic breakdown protection; and with these advantages, there can be realized high speed action and low power consumption of the circuit.

The use of the TSV technology makes it possible to obtain not only an electronic device including an analog or digital circuit, a memory circuit such as a DRAM, a logic circuit such as a CPU or the like but also an electronic device including different types of circuits such as an analog high frequency circuit and a low frequency, low power consumption circuit prepared in different processes and stacked together.

By applying the TSV technology to a three-dimensional integrated circuit (3D-IC), many functions can be packed into a small footprint. In addition, important electrical pathways between elements can be dramatically shortened to increase processing speed.

In order to apply the TSV technology, a via (through electrode) must be formed. For this purpose, there has been widely used a method of forming a through electrode by Cu electroplating.

However, the electroplating decreases the production efficiency because of its inevitable long processing time. Moreover, since the via typically has an aspect ratio of 5 or more and usually has a rugged inner wall surface, it is difficult to uniformly form a plating primary film over the inner wall surface of the via. This produces a void or gap between the inner wall surface of the via and a plating film to be used as the through electrode, thereby causing an increase in electrical resistance, decreased reliability and so on. Furthermore, there is also such a limit that the electrical resistance cannot be set lower than the inherent electrical resistance of Cu.

Still furthermore, the progress in improving the packaging density, the performance and the processing speed and reducing the size, the thickness and the weight of the electronic device because of the use of the TSV technology not only increases heat that will be generated by the operation but also makes it difficult to prepare a heat dissipation structure for it, so that the question of how to dissipate heat becomes a major issue. If the heat dissipation is insufficient, accumulation of the generated heat leads to abnormal heat generation, impairing bonding strength of the electronic component and damaging reliability of the electrical connection or changing electrical characteristics of the electronic component and at worst, causing thermal runaway, thermal breakdown or the like.

As such a heat dissipation means, there have been known various types of technologies. For example, Japanese Unexamined Patent Application Publication No. 2008-294253 discloses a technology of forming a heat transmission via conductor by filling a conductive paste including Ag powder. On the other hand, Japanese Unexamined Patent Application Publication No. 2005-158957 discloses a technology of forming a thermal via, wherein the thermal via comprises a metal (copper, solder or gold) having a good thermal conductivity and a via is formed from an upper surface of a light-emitting element submount structure, the via is coated with gold at its side face and then filled with solder. Japanese Unexamined Patent Application Publication No. 10-098127 discloses a thermal conductor comprising a metal powder-containing resin such as a silver paste or a copper paste, a composite of a metal rod and the metal powder-containing resin or the like. Moreover, Japanese Unexamined Patent Application Publication No. 2007-294834 discloses a thermal via comprising a metal such as Cu or Ni. However, any related art has a problem to be solved, such as improvement in heat dissipation characteristics, manufacturing cost reduction or the like.

SUMMARY OF THE INVENTION

It is an object of the present invention to provide a substrate for an electronic device with a heat transfer pathway having excellent heat dissipation characteristics and an electronic device using the same.

It is another object of the present invention to provide a substrate for an electronic device with a through electrode structure having a low electrical resistance and an electronic device using the same.

It is still another object of the present invention to provide a substrate for an electronic device in which a through electrode structure having a low electrical resistance and a heat transfer pathway having excellent heat dissipation characteristics can be formed efficiently in a short time and an electronic device using the same.

In order to achieve the above object, a substrate for an electronic device according to the present invention comprises a plurality of through electrodes, the through electrode having a nanocomposite structure including a nm-sized carbon nanotube and being a casting formed by using a via formed in the substrate as a mold.

In the present invention, the term "nm-sized" means having a size within a range of 1 μm or less. On the other hand, the term "nanocomposite structure" means that at least two kinds of components are combined to constitute a composite where the components are nm-sized particles or in a crystal or amorphous phase.

In the substrate according to the present invention, since the through electrode is a casting formed by using a via formed in the substrate as a mold, as described above, the substrate can be provided with a through electrode that has a high adhesion strength to a side wall surface of the via, a compact structure free from any cavity, void or hollow, a low electrical resistance and an excellent electrical conductivity. Even if the inner wall surface of the via has irregularities, the through electrode can be casted to conform to the irregularities, so that there can be obtained a through electrode having a high adhesion strength to the via.

Moreover, since the through electrode can be casted to conform to the irregularities of the inner wall surface of the via, the through electrode and the irregularities of the inner wall surface of the via serve as an anchor for preventing slippage of the through electrode, thereby increasing the bonding strength of the through electrode to the substrate. This means that unlike in the case where the through electrode is formed by plating, the inner wall surface of the via does not require accuracy for the irregularities, but rather a preferable result can be obtained with certain irregularities. This makes it easy to form the via.

Since there are two or more through electrodes, the through electrodes can be used as a positive or negative electrode for an electronic component or an electronic device to be mounted on the substrate. Therefore, electrical wiring such as wire bonding becomes unnecessary, so that the product cost can be reduced by cutting the production facility cost that has been spent on an expensive wire bonding apparatus.

Furthermore, the through electrode has a nanocomposite structure including a nm-sized carbon nanotube. The carbon nanotube has a high thermal conductivity which is 10 times greater than that of copper. This makes it possible to realize a through electrode having extremely high heat dissipation characteristics.

The carbon nanotube also has a high current density resistance of $10^9$ A/cm$^2$ which is more than 1,000 times greater than that of copper. Moreover, since the carbon nanotube has less electron scattering as compared with copper being a good electrical conductor, it has a low electrical resistance. As compared with copper, accordingly, the through electrode including a carbon nanotube has a low electrical resistance and can reduce the quantity of heat due to resistance even if a large current is passed.

The through electrode has a nanocomposite structure including a nm-sized carbon nanotube having such characteristics. In the through electrode having a nanocomposite structure, stress can be reduced because of the nm-sized effect. This inhibits characteristic degradation of a semiconductor circuit in a semiconductor substrate. It can also inhibit the occurrence of fracturing or cracking of the substrate.

The through electrode may comprise the carbon nanotube alone or may have a nanocomposite structure including the nm-sized carbon nanotube and a metal/alloy component having a nanocomposite crystal structure. Since the through electrode having a nanocomposite structure including the nm-sized carbon nanotube and the metal/alloy component having a nanocomposite crystal structure includes a structure (crystal) whose size is limited to a nano level, stress that will be generated in the through electrode can be reduced accordingly. Moreover, the nanocomposite crystal structure is also capable of facilitating formation of equiaxed crystal in the vertical conductor. The above-described particular characteristics of the nanocomposite crystal structure and the nanocomposite structure inhibit characteristic degradation of a semiconductor circuit, particularly, in a semiconductor substrate. It can also inhibit the occurrence of fracturing or cracking of the substrate.

In the present invention, the term "nanocomposite crystal structure" basically refers to a structure in which nanoparticles are dispersed in crystal grains (intragranular nanocomposite crystal structure) or a structure in which nanoparticles are dispersed in grain boundaries (interglanular nanocomposite crystal structure).

It may also comprise a composite material that is turned into a paste by mixing the carbon nanotube with an organic material, wherein, if necessary, inorganic powder may be mixed or a metal/alloy component having a nanocomposite crystal structure may be added as a third component.

The substrate supporting the through electrode can include at least one of an inorganic substrate such as of ceramic, an organic substrate such as one used for a copper-clad substrate and a semiconductor substrate. In the case where the inorganic substrate and the organic substrate comprising the substrate have an electrical conductivity and in the case where it comprises the semiconductor substrate, the through electrode is electrically insulated from the conductive inorganic substrate, the conductive organic substrate and the semiconductor substrate by an electrical insulating film or layer. This insulating structure can be realized by an insulating film obtained by oxidizing or nitriding the inner wall surface of a via that will act as a mold for the through electrode or an insulating layer adhered to the inner wall surface of the via. The above-described insulating structure may be provided in the form of a ring at a small distance around the via.

According to another aspect, the present invention provides a substrate comprising a plurality of columnar heat sinks independently of or along with the through electrodes. The columnar heat sink is a casting formed by using a via formed in the substrate as a mold.

Since the columnar heat sink is also a casting formed by using a via formed in the substrate as a mold, the substrate can be provided with a columnar heat sink that has a high adhesion strength to the side wall surface of the via, a compact structure free from any cavity, void or hollow and excellent thermal conductivity and heat dissipation characteristics.

Moreover, the columnar heat sink having a high adhesion strength to the side wall surface of the via and a compact structure free from any cavity, void or hollow can be formed efficiently in a short time, as compared with the case where it is formed by using another method such as plating.

The columnar heat sink has a nanocomposite structure including a metal/alloy component having a nanocomposite crystal structure. This results in reducing stress that will be generated in the columnar heat sink. Moreover, the nanocomposite crystal structure is also capable of facilitating formation of equiaxed crystal in the columnar heat sink.

The above-described particular characteristics of the nanocomposite crystal structure and the nanocomposite structure inhibit characteristic degradation of a semiconductor circuit formed on a semiconductor substrate (wafer). It can also inhibit the occurrence of fracturing or cracking of the semiconductor substrate.

The columnar heat sink may include a nm-sized carbon atom structure having an excellent thermal conductivity along with or independently of the metal/alloy component having a nanocomposite crystal structure. Such a carbon atom structure includes at least one of a diamond, a fullerene and a carbon nanotube.

The above-described columnar heat sink has excellent heat dissipation characteristics because of the high thermal conductivity of the carbon atom structure. Particularly, the carbon nanotube has a high thermal conductivity which is 10 times greater than that of copper, ensuring extremely high heat dissipation characteristics. It may comprise a composite material that is turned into a paste by further adding an organic component as a third component, if necessary.

The substrate according to the present invention may comprise both the through electrode and the columnar heat sink. Specifically, it may be constructed as follows.

(a) The through electrode has a nanocomposite structure including a nm-sized carbon nanotube and is a casting formed by using a via formed in the substrate as a mold, while the columnar heat sink is a casting formed by using a via formed in the substrate as a mold.

(b) In the above (a), the through electrode and the columnar heat sink have a nanocomposite structure including a metal/alloy component having a nanocomposite crystal structure.

(c) In the above (a), the columnar heat sink has a nanocomposite structure including a nm-sized carbon atom structure having an excellent thermal conductivity (a diamond, a fullerene, a carbon nanotube or the like).

(d) In the above (a), the columnar heat sink has a nanocomposite structure including a metal/alloy component having a nanocomposite crystal structure and a nm-sized carbon atom structure having an excellent thermal conductivity.

(e) The through electrode is a casting formed by using a via formed in the substrate as a mold, while the columnar heat sink has a nanocomposite structure including a metal/alloy component having a nanocomposite crystal structure and is a casting formed by using a via formed in the substrate as a mold.

(f) In the above (e), the columnar heat sink has a nanocomposite structure including a nm-sized carbon atom structure.

(g) The through electrode is a casting formed by using a via formed in the substrate as a mold, while the columnar heat sink has a nanocomposite structure including a nm-sized carbon atom structure having an excellent thermal conductivity (a diamond, a fullerene, a carbon nanotube or the like).

The above-described substrate can be combined with an electronic component to provide an electronic device. In this case, the electronic component is mounted on the substrate. Thus, an electrical circuit can be made for the electronic component using the through electrode having a low electrical resistance, while heat generated by the operation of the electronic component can be efficiently dissipated through the columnar heat sink, thereby avoiding characteristic change, malfunction and even thermal runaway due to the heat generation of the electronic component.

In the present invention, the electronic component may be an active element, a passive component or a composite element thereof. On the other hand, the electronic device may be almost any electrical product based on the technology of the electronics. The electronic device may also be one having a three-dimensional multilayer structure based on the TSV technology or one having a three-dimensional multilayer structure constructed by combining an interposer and various types of elements.

The present invention will be more fully understood from the detailed description given hereinbelow and the accompanying drawings which are given by way of illustration only, and thus not to be considered as limiting the present invention.

DESCRIPTION OF THE PREFERRED EMBODIMENTS

Figure 1:
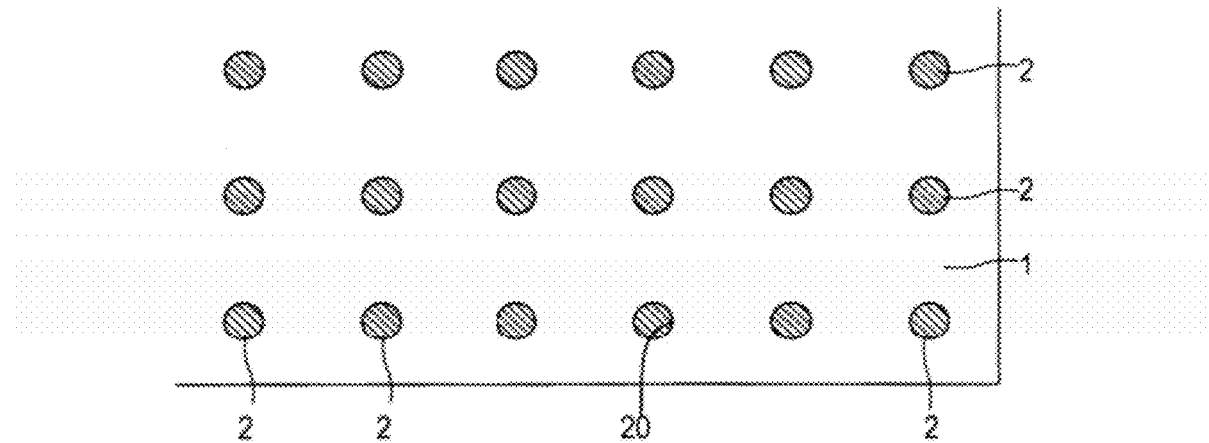
FIG. 1 is a plan view showing a part of a substrate according to the present invention.
Figure 2:
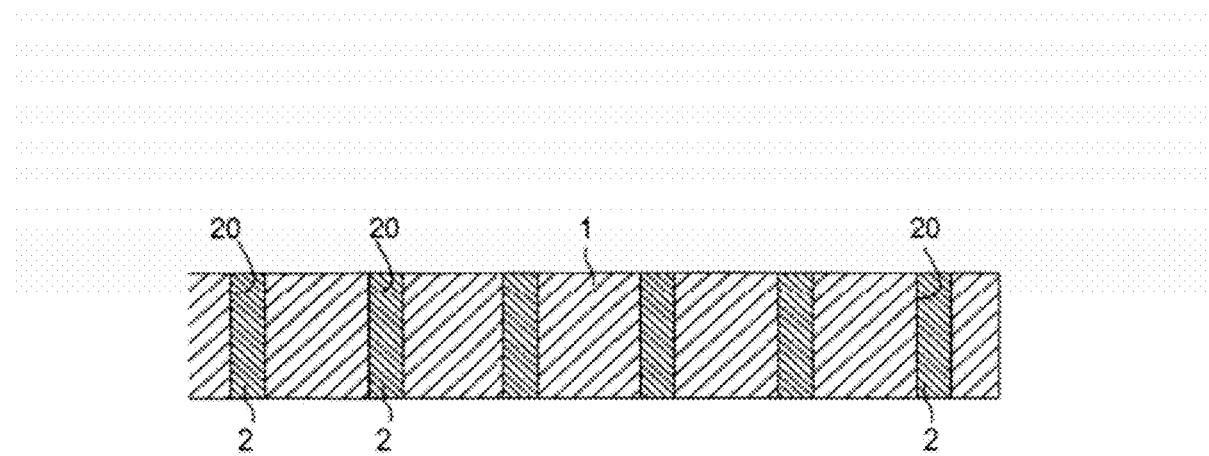
FIG. 2 is a sectional view of the substrate shown in FIG. 1.

Referring to FIGS. 1 and 2, a substrate 1 for an electronic device according to the present invention comprises a plurality of through electrodes 2 arranged at a given pitch of the order of μm. The via diameter of the through electrode 2 is also of the order of μm. The through electrode 2 has a nanocomposite structure including a nm-sized carbon nanotube and is a casting formed by using a via 20 formed in the substrate 1 as a mold.

Since the through electrode 2 is a casting formed by using the via 20 formed in the substrate 1 as a mold, as described above, the substrate 1 can be provided with a through electrode 2 that has a high adhesion strength to a side wall surface of the via 20, a compact structure free from any cavity, void or hollow, a low electrical resistance and an excellent electrical conductivity. Even if the inner wall surface of the via 20 has irregularities, the through electrode 2 can be casted to conform to the irregularities, so that there can be obtained a through electrode 2 having a high adhesion strength to the via 20.

Moreover, since the through electrode 2 can be casted to conform to the irregularities of the inner wall surface of the via 20, the through electrode 2 and the irregularities of the inner wall surface of the via 20 serve as an anchor for preventing slippage of the through electrode 2, thereby increasing the bonding strength of the through electrode 2 to the substrate 1. This means that unlike in the case where the through electrode 2 is formed by plating, the inner wall surface of the via 20 does not require accuracy for the irregularities, but it is rather preferable to have certain irregularities. This makes it easy to form the via 20.

Figure 3:
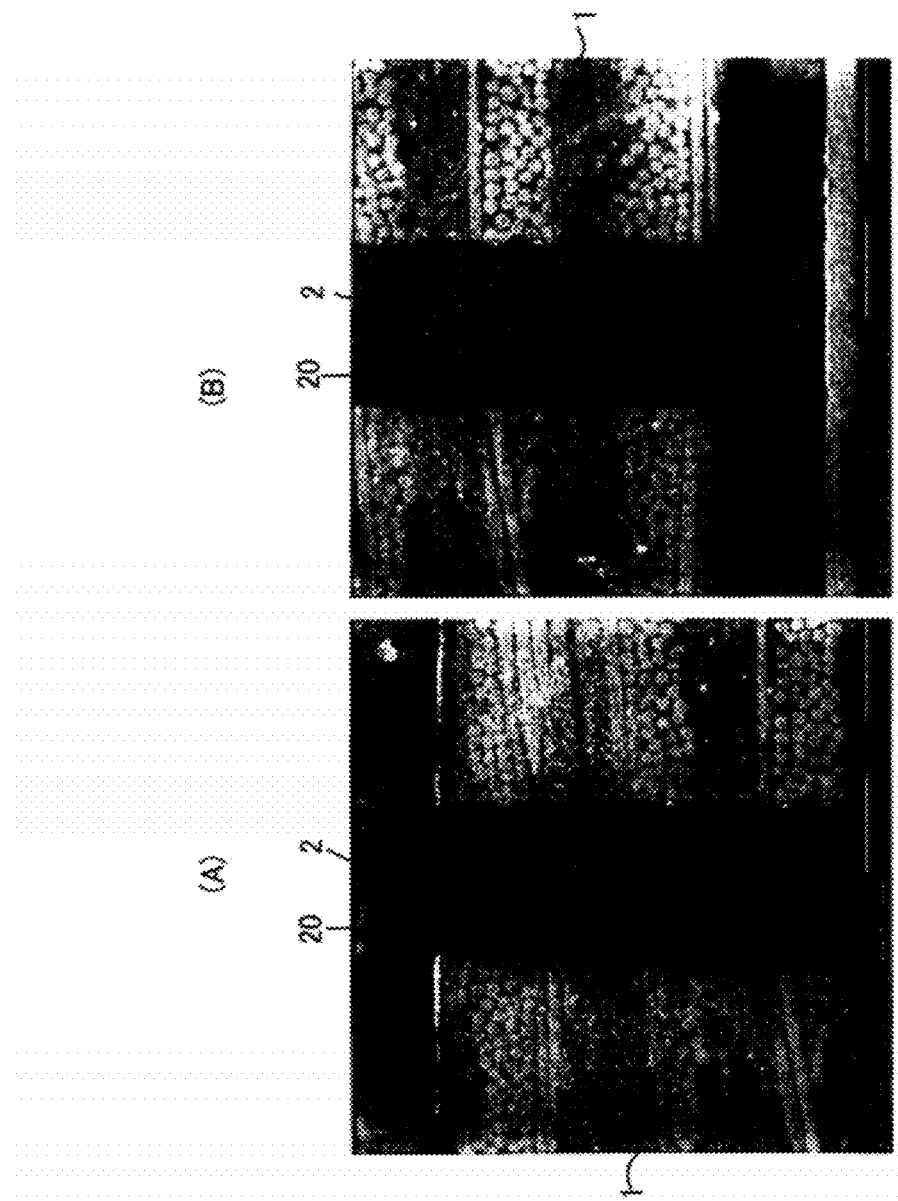
FIG. 3 is a SEM image of a section of a substrate according to the present invention.

Referring to FIG. 3 showing a SEM image, the through electrode 2 is filled in the via 20 formed in the substrate 1 to have a compact structure free from any cavity, void or hollow, wherein the through electrode 2 is kept in close contact with the side wall surface of the via 20 even though the side wall surface of the via 20 has irregularities.

The via 20 can be drilled by laser, chemical etching, plasma etching or the like and its inner wall surface has irregularities due to the via drilling process, but as shown in FIG. 3, even though the inner wall surface of the via 20 has irregularities, the through electrode 2 is filled to conform to the irregularities and brought into close contact with the inner wall surface of the via 20 to have a compact structure free from any cavity, void or hollow. Moreover, since the irregularities of the inner wall surface of the via 20 create a kind of anchoring effect, the through electrode 2 can be reliably secured within the via 20 without causing loosening or floating from the via 20. In other words, this means that as compared with a common technique using both sputtering and plating for its formation, the via 20 can be formed with less attention to the flatness of the inner wall surface, but rather a preferable result can be obtained by forming the via 20 with certain roughness.

The through electrode 2 has a nanocomposite structure including a nm-sized carbon nanotube. The carbon nanotube is a material in which a six-member carbon ring (graphene sheet) is formed into a single- or multi-walled coaxial tube. Either a single-walled nanotube (SWNT) or a multi-walled nanotube (MWNT) can be used. More specifically, there can be used a composite material in which nm-sized carbon nanotubes are oriented and added as a filler into an aluminum alloy.

The carbon nanotube has a high thermal conductivity which is 10 times greater than that of copper, providing extremely high heat dissipation characteristics. The carbon nanotube also has a high current density resistance of $10^9$ $A/cm^2$ which is more than 1,000 times greater than that of copper. Moreover, since the carbon nanotube has less electron scattering as compared with copper being a good electrical conductor, it has a low electrical resistance. As compared with copper, accordingly, the through electrode 2 including a carbon nanotube has a low electrical resistance and can reduce the quantity of heat due to resistance even if a large current is passed. The carbon nanotube has a diameter of a few nm and is cut into a length of 500 nm or less, preferably, 200 to 300 nm, for use in the present invention.

The through electrode 2 may comprise the carbon nanotube alone or a composite material including the carbon nanotube and a metal/alloy component having a nanocomposite crystal structure.

Since the through electrode 2 having a nanocomposite structure including the nm-sized carbon nanotube and the metal/alloy component having a nanocomposite crystal structure includes a structure (crystal) whose size is limited to a nano level, stress that will be generated in the through electrode 2 can be reduced accordingly. Moreover, the nanocomposite crystal structure is also capable of facilitating formation of equiaxed crystal in the vertical conductor. The above-described particular characteristics of the nanocomposite structure and the nanocomposite crystal structure inhibit characteristic degradation of a semiconductor circuit, particularly, in a semiconductor substrate. It can also inhibit the occurrence of fracturing or cracking of the substrate 1.

Examples of the metal/alloy component having a nanocomposite crystal structure include Bi, In, Sn and Cu. Particularly when Bi is contained, the through electrode 2 can be formed compactly inside the via 20 without leaving any hollow or void because of volumetric expansion characteristics of Bi during the solidification. However, since the presence of Bi tends to increase the electrical resistance, it is preferred that Bi is used to such an extent as to meet a required electrical resistance.

It may also comprise a composite material prepared by mixing the nm-sized carbon nanotube with an organic material, wherein, if necessary, inorganic powder of ceramic, glass or the like or a metal/alloy component having a nanocomposite crystal structure may be added thereto.

The substrate 1 supporting the through electrode 2 can include at least one of an inorganic substrate such as of ceramic, an organic substrate such as one used for a copper-clad substrate and a semiconductor substrate. Any type of semiconductor substrate can be used without particular limitation. There can be used not only an Si substrate (silicon substrate), an SiC substrate (silicon carbide substrate), a GaN substrate (gallium nitride substrate) and a ZnO substrate (zinc oxide substrate) but also an SOI substrate (silicon on insulator substrate) or the like. In the case where the inorganic substrate and the organic substrate comprising the substrate 1 have an electrical conductivity and in the case where the substrate 1 comprises the semiconductor substrate, the through electrode 2 is electrically insulated from the conductive inorganic substrate, the conductive organic substrate and the semiconductor substrate by an electrical insulating film or layer. This insulating structure can be realized by an insulating film obtained by oxidizing or nitriding the inner wall surface of the via 20 that will act as a mold for the through electrode 2 or an insulating layer adhered to the inner wall surface of the via 20. The above-described insulating layer may be provided in the form of a ring at a small distance around the via 20.

Figure 4:
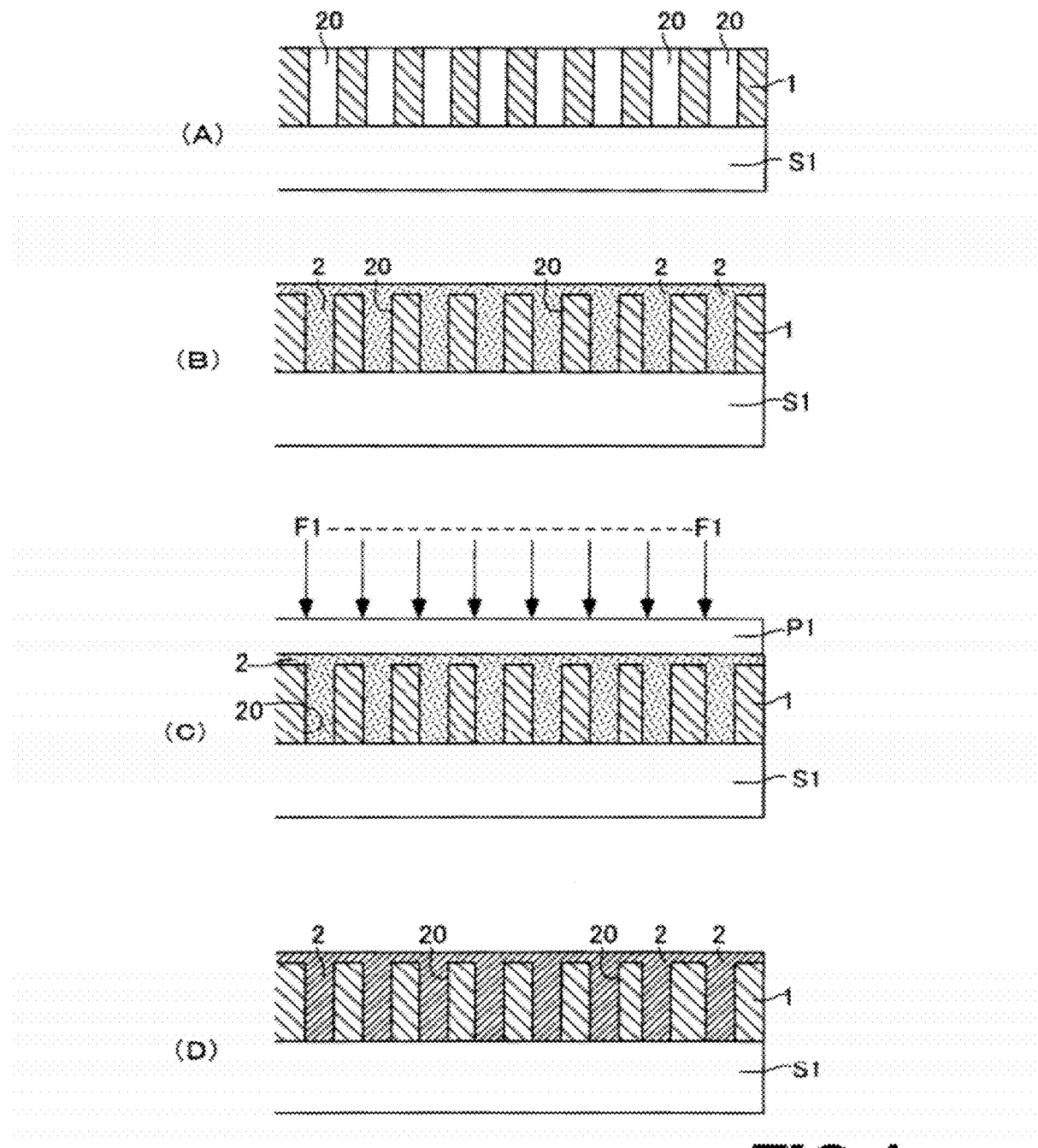
FIG. 4 is a drawing showing a process of manufacturing a substrate according to the present invention.

To form the through electrode 2, at first, as shown in FIG. 4(A), a substrate 1 having a number of small vias 20 previously formed to pass through it in the thickness direction is put on a support S1. The via 20 is closed at its lower side by the support S1. Alternatively, the via 20 may be a non-through-hole.

Then, as shown in FIG. 4(B), the vias 20 formed in the substrate 1 are used as a mold and an electrode material 2 in the form of liquid, paste or powder is poured into them. Then, as shown in FIG. 4(C), the electrode material 2 poured into the vias 20 is solidified while being subjected to a mechanical force F1 such as a pressing pressure using a pressing plate P1, an injection pressure or a rolling pressure. Thus, as shown in FIG. 4(D), the through electrode 2 can be formed as a casting having a compact structure free from any cavity, void or hollow and kept in close contact with the side wall surface of the via 20. It should be noted that the structure of the casting can be seen from the SEM image of FIG. 3.

Preferably, the process of pouring the electrode material 2 into the vias 20 formed in the substrate 1 is performed inside a vacuum chamber under a reduced pressure. This is because differential pressure filling can be performed by using this reduced pressure and a pressure to be applied subsequently.

In the case where the electrode material 2 has a nanocomposite structure including a carbon nanotube and a metal/alloy component having a nanocomposite crystal structure, a liquid composite material 2 prepared by mixing a molten metal of the metal/alloy component with the nm-sized carbon nanotube is poured into the vias 20, and the poured liquid composite material 2 is cooled and solidified while being subjected to a pressing pressure using the pressing plate P1, an injection pressure or a rolling pressure.

In the case where the electrode material 2 is a paste material including a carbon nanotube, an organic material and a solvent, on the other hand, it is hardened by heating while being subjected to a pressing pressure using the pressing plate P1, an injection pressure or a rolling pressure. In the case where the electrode material 2 is a powder material, it may be poured into the vias 20 in a molten state or put in the vias 20 in a powder state and then melted by heating.

Figure 5:
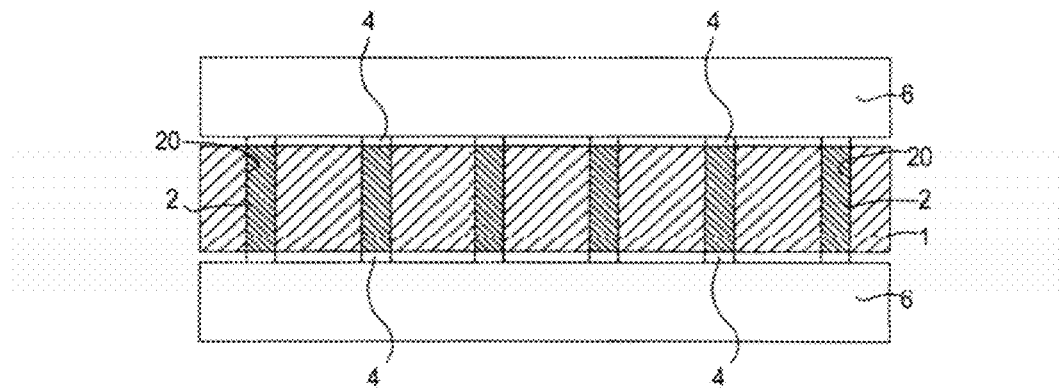
FIG. 5 is a partial sectional view of an electronic device having a substrate according to the present invention.

FIG. 5 shows an electronic device in which the substrate shown in FIGS. 1 and 2 is used as an interposer. The substrate 1 is disposed as an interposer between electronic devices 6, 6 such as a semiconductor chip. The electronic devices 6, 6 have electrodes connected to the through electrode 2 through junction films 4, 4, respectively.

Since there are two or more through electrodes 2, the two or more separate through electrodes 2 can be used as a positive or negative electrode for the electronic devices 6, 6 to be mounted on the substrate 1. Therefore, electrical wiring such as wire bonding becomes unnecessary, so that the product cost can be reduced by cutting the production facility cost that has been spent on an expensive wire bonding apparatus.

Figure 6:
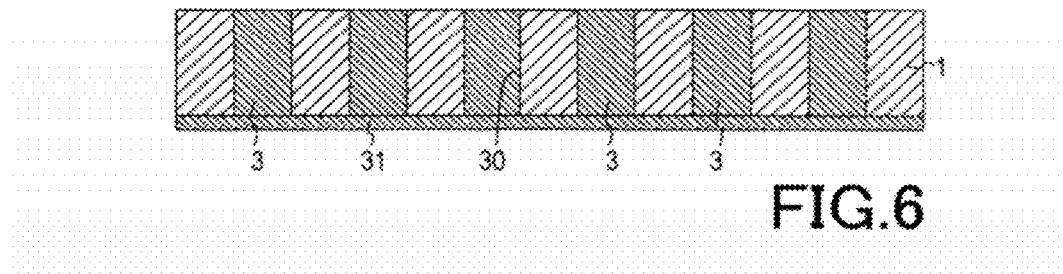
FIG. 6 is a drawing showing another embodiment of a substrate according to the present invention.

The substrate 1 may comprise columnar heat sinks independently of or along with the through electrodes 2. Referring first to FIG. 6, the substrate 1 has columnar heat sinks 3. The columnar heat sink 3 is a casting formed by using a via 30 formed in the substrate 1 as a mold. Many columnar heat sinks 3 passing through the substrate 1 in the thickness direction are arranged at a small distance from each other, for example, in the form of matrix. The columnar heat sinks 3 have first ends (lower ends) connected together through a heat dissipation layer 31 provided on a back surface (second surface) of the substrate 1 and second ends (upper ends) led to a front surface of the substrate 1. Another heat dissipation layer may also be provided on the front surface. In the case where the inorganic substrate and the organic substrate comprising the substrate 1 have an electrical conductivity, the columnar heat sink 3 is electrically insulated from the conductive inorganic substrate, the conductive organic substrate and the semiconductor substrate by an electrical insulating film or layer. This insulating structure can be realized by an insulating film obtained by oxidizing or nitriding the inner wall surface of the via 30 that will act as a mold or an insulating layer adhered to the inner wall surface of the via 30. The above-described insulating layer may be provided in the form of a ring at a small distance around the via 30.

Since the columnar heat sink 3 is also a casting formed by using the via 30 formed in the substrate 1 as a mold, the substrate 1 can be provided with a columnar heat sink 3 that has a high adhesion strength to the side wall surface of the via 30, a compact structure free from any cavity, void or hollow and excellent thermal conductivity and heat dissipation characteristics.

Moreover, the columnar heat sink 3 having a high adhesion strength to the side wall surface of the via and a compact structure free from any cavity, void or hollow can be formed efficiently in a short time, as compared with the case where it is formed by using another method such as plating.

If a thermal via is formed after plating of the side face of the via 30 as a technique for formation of the columnar heat sink 3, the inner wall surface of the via 30 has to be a smooth surface having extremely small irregularities so as to form a continuous plating film, which will need a long time for the via formation process. Moreover, if the via 30 has a high aspect ratio, it becomes extremely difficult to form a plating primary film as a continuous homogeneous film.

In the present invention in which the columnar heat sink 3 is a casting formed by using the via 30 formed in the substrate 1 as a mold, on the other hand, even if the inner wall surface (side wall surface) of the via 30 has irregularities, the columnar heat sink 3 can be filled to conform to the irregularities in the course of casting. Therefore, the obtained columnar heat sink 3 has a compact structure free from any cavity, void or hollow and in close contact with the side wall surface of the via 30. This realizes a columnar heat sink 3 having an excellent thermal conductivity and heat dissipation characteristics.

Moreover, since the irregularities of the inner wall surface of the via 30 create a kind of anchoring effect, the columnar heat sink 3 can be reliably secured within the via 30 without causing loosening or floating from the via 30. In other words, this means that as compared with a conventional technique, the via 30 can be formed with less attention to the flatness of the inner wall surface, but rather a preferable result can be obtained by forming the via 30 with certain roughness.

Since many columnar heat sinks 3 are distributed over the substrate 1 with their first ends (lower ends) connected together through the heat dissipation layer 31 provided on the back surface (second surface) of the substrate 1, there is formed a three-dimensional heat dissipation pathway in which heat transferred from the columnar heat sinks 3 in the thickness direction of the substrate 1 can be dissipated while being dispersed in a direction parallel to a plane perpendicular to the thickness direction. This improves heat dissipation characteristics. Heat generated by the operation of the electronic component or the electronic device 6 can be dissipated to the outside of the substrate 1 more efficiently by properly selecting the thermal resistance of the material constituting the columnar heat sinks 3 and the occupancy rate of the columnar heat sinks 3.

Basically, the heat dissipation characteristics of the columnar heat sinks 3 depend on the thermal conductivity (or thermal resistance) of the constituent material and the total occupancy rate of the columnar heat sinks 3 to a plane area of the substrate 1. For example, if a low-thermal resistance material is used for the columnar heat sink 3, the occupancy rate can be reduced, while if a high-thermal resistance material is used, the occupancy rate can be increased. That is, the occupancy rate of the columnar heat sinks 3 can be determined in consideration of the thermal conductivity of the constituent material. On the other hand, if there is a limit to the occupancy rate, materials having a suitable thermal conductivity can be selected in consideration of required heat dissipation characteristics.

The columnar heat sink 3 can have a nanocomposite structure including a metal/alloy component having a nanocomposite crystal structure. This results in reducing stress that will be generated in the columnar heat sink 3. Moreover, since the nanocomposite crystal structure is also capable of facilitating formation of equiaxed crystal in the columnar heat sink 3, the stress can be further reduced.

The above-described particular characteristics of the nanocomposite crystal structure inhibit characteristic degradation of a semiconductor circuit formed on the substrate 1. It can also inhibit the occurrence of fracturing or cracking of the substrate 1.

Specific examples of the nanocomposite crystal structure material constituting the columnar heat sink 3 include, but not limited to, Al, Au, Cu, Ag and Sn. However, since it is desirable to reduce the thermal resistance of the columnar heat sink 3 as much as possible, the material, composition ratio and so on should be determined from such a viewpoint. In the illustrated embodiment, the columnar heat sink 3 is a solid column having a circular section, but it may have a polygonal section.

The columnar heat sink 3 may include a nm-sized carbon atom structure having an excellent thermal conductivity along with or independently of the metal/alloy component having a nanocomposite crystal structure. At least one of a diamond, a fullerene and a carbon nanotube can be given as a specific example of such a carbon atom structure.

The columnar heat sink 3 including the carbon atom structure has excellent heat dissipation characteristics because of the high thermal conductivity of the carbon atom structure. Particularly, the carbon nanotube has a high thermal conductivity which is 10 times greater than that of copper, ensuring extremely high heat dissipation characteristics. More specifically, there can be used a material in which carbon nanotubes are oriented and added as a filler into an aluminum alloy. In combination with the carbon nanotubes, vapor-grown carbon fibers having a larger fiber thickness may also be used as a filler. This composite material has a thermal conductivity which is more than 3 times greater than that of the aluminum alloy. For use, the carbon nanotube is cut into a length of 500 nm or less, preferably, 200 to 300 nm.

Figure 7:
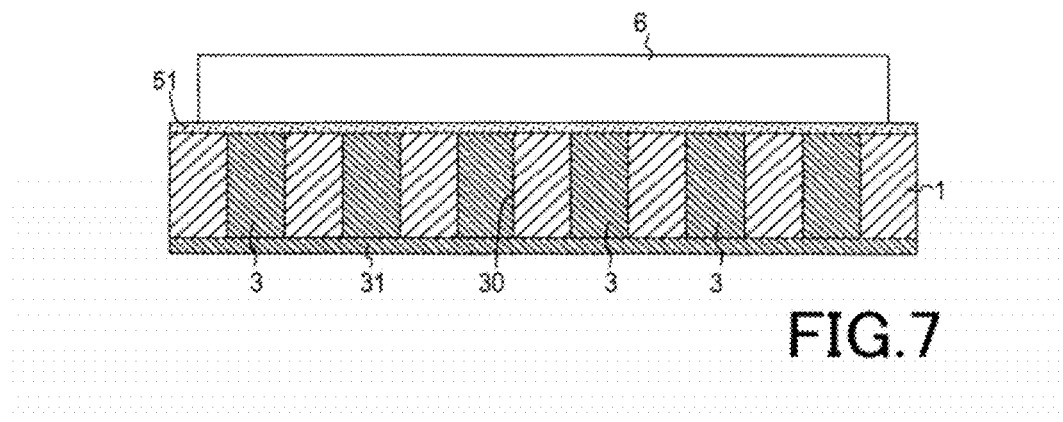
FIG. 7 is a partial sectional view of an electronic device having the substrate shown in FIG. 6.

When used in an electronic device, the heat dissipation substrate according to the present invention is provided with a heat-generating electronic component and used to dissipate the heat to the outside. FIG. 7 shows one embodiment of such an electronic device. On one surface of the substrate 1 shown in FIG. 6, a heat-generating electronic component or electronic device 6 is mounted through a thermally conductive binder layer 51. Preferably, a heat dissipation block is thermally coupled to the heat dissipation 31. The electronic component or electronic device 6 is, for example, an active element such as a semiconductor chip, a passive component such as a capacitor or an inductor or a composite element thereof. The electronic component or electronic device 6 may have a semiconductor element and a passive component in combination or may be a memory element, a logic circuit element or an analog circuit element. It may have a single layer structure or a multilayer structure of such elements.

It should be noted that the substrate 1 according to the present invention has the columnar heat sink 3 being a casting formed by using the via 30 as a mold, and the columnar heat sink 3 creates a heat dissipation pathway that is in close contact with the side wall surface of the via 30 and has a compact structure free from any cavity, void or hollow and excellent thermal conductivity and heat dissipation characteristics. When it is used in an electronic device, therefore, heat generated at the electronic component or electronic device 6 can be efficiently and reliably dissipated through the columnar heat sink 3 having an excellent thermal conductivity and heat dissipation characteristics, thereby avoiding abnormal heat generation, thermal runaway or malfunction of the electronic component or electronic device 6.

Figure 8:
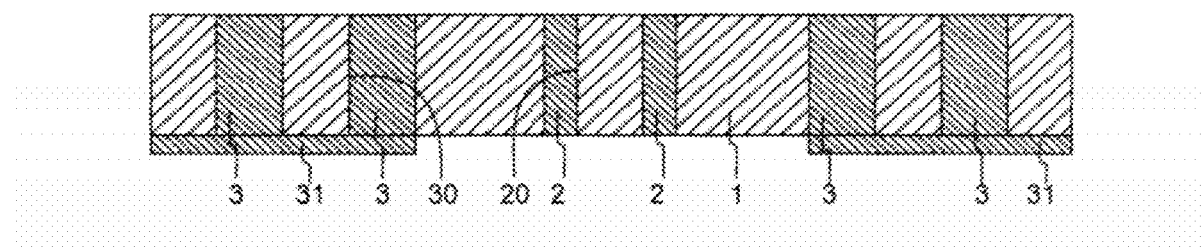
FIG. 8 is a drawing showing another embodiment of a substrate according to the present invention.

Referring next to FIG. 8, the illustrated substrate 1 comprises both the through electrode 2 and the columnar heat sink 3. In this case, the through electrode 2 and the columnar heat sink 3 may be combined as follows. Substrate 1 has a first side 1B and a second side 1A.

(a) The through electrode 2 has a nanocomposite structure including a nm-sized carbon nanotube and is a casting formed by using the via 20 formed in the substrate 1 as a mold, while the columnar heat sink 3 is a casting formed by using the via 30 formed in the substrate 1 as a mold.

(b) In the above (a), the through electrode 2 and the columnar heat sink 3 have a nanocomposite structure including a metal/alloy component having a nanocomposite crystal structure.

(c) In the above (a), the columnar heat sink 3 has a nanocomposite structure including a nm-sized carbon atom structure having an excellent thermal conductivity (a diamond, a fullerene, a carbon nanotube or the like).

(d) In the above (a), the columnar heat sink 3 has a nanocomposite structure including a metal/alloy component having a nanocomposite crystal structure and a nm-sized carbon atom structure having an excellent thermal conductivity (a diamond, a fullerene, a carbon nanotube or the like).

(e) The through electrode 2 is a casting formed by using the via 20 formed in the substrate 1 as a mold, while the columnar heat sink 3 has a nanocomposite structure including a metal/alloy component having a nanocomposite crystal structure and is a casting formed by using the via 30 formed in the substrate 1 as a mold. It is not necessarily required that the through electrode 2 includes a carbon nanotube.

(f) In the above (e), the columnar heat sink 3 has a nanocomposite structure including a nm-sized carbon atom structure having an excellent thermal conductivity (a diamond, a fullerene, a carbon nanotube or the like).

(g) The through electrode 2 is a casting formed by using the via 20 formed in the substrate 1 as a mold, while the columnar heat sink 3 has a nanocomposite structure including a nm-sized carbon atom structure having an excellent thermal conductivity (a diamond, a fullerene, a carbon nanotube or the like). It is not necessarily required that the through electrode 2 includes a carbon nanotube.

Figure 9:
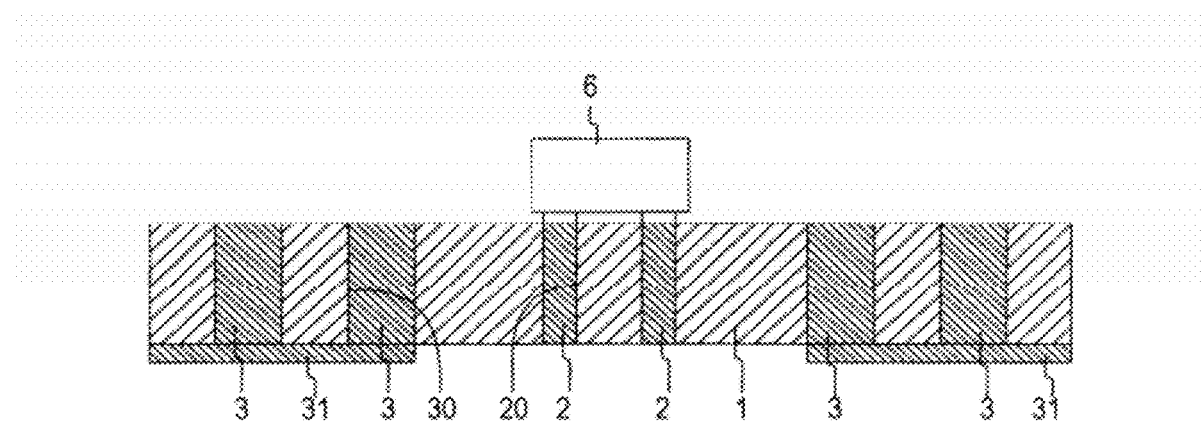
FIG. 9 is a partial sectional view of an electronic device having the substrate shown in FIG. 8.

As shown in FIG. 9, the above-described substrate 1 can be combined with an electronic component 6 to provide an electronic device. The electronic component 6 is mounted on the substrate 1 with its electrode bonded to the through electrode 2. Thus, an electrical circuit can be made for the electronic component 6 using the through electrode 2 having a low electrical resistance, while heat generated by the operation of the electronic component 6 can be efficiently dissipated through the columnar heat sink 3, thereby avoiding characteristic change, malfunction and even thermal runaway due to the heat generation of the electronic component 6.

In the present invention, the electronic component may be an active element, a passive component or a composite element thereof. Typical examples of the active element include a light-emitting diode, various types of memories, various types of logic ICs and an analog circuit element. Examples of the passive component include a capacitor, an inductor, a resistor or a composite element thereof.

In the present invention, the electronic device may be almost any electrical product based on the technology of the electronics. Specific examples include a personal computer, a mobile phone, a digital appliance, a light-emitting device using a light-emitting diode, a lighting apparatus, a traffic light, an image processing device, an image sensor and a vehicle-mounted electronic device. It may also be one having a three-dimensional multilayer structure based on the TSV technology or one having a three-dimensional multilayer structure constructed by combining an interposer and various types of elements. Next will be described specific embodiments of electronic components and electronic devices. In any illustrative embodiment, through electrodes and columnar heat sinks have the same features and effects as described above, so that duplicate explanations are omitted.

Embodiment 1

Light-Emitting Diode and Light-Emitting Device

Figure 10:
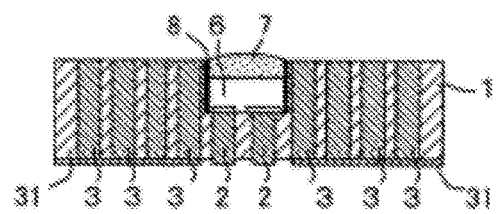
FIG. 10 is a partial sectional view showing one embodiment of a light-emitting device according to the present invention.
Figure 11:
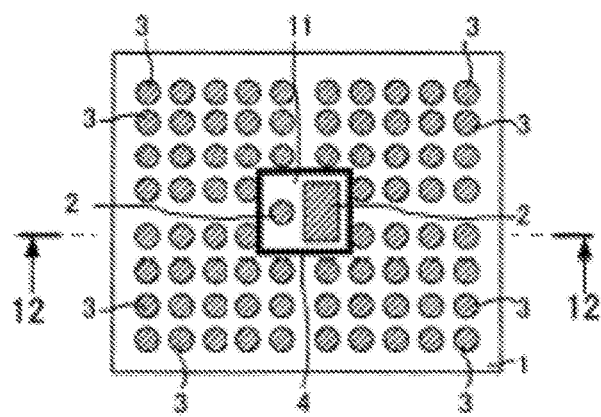
FIG. 11 is a plan view of a support used in the light-emitting device shown in FIG. 10.
Figure 12:
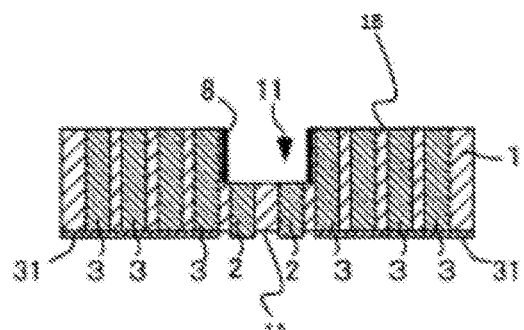
FIG. 12 is a sectional view taken along line 12-12 in FIG. 11.

A light-emitting device shown in FIGS. 10 to 12 comprises a substrate 1 and a light-emitting element 6. The light-emitting element 6 is covered with a fluorescent layer 7. The substrate 1 serves as a so-called package, includes two through electrodes 2, 2 and a number of columnar heat sinks 3 and has a cavity 11 at one side thereof. Preferably, the substrate 1 includes Si as a main component. Alternatively, the substrate 1 may be an insulating resin substrate or an insulating ceramic substrate. In the figures, the substrate 1 has a rectangular outline but its shape is arbitrary. The cavity 11 of the substrate 1 is formed to surround the through electrodes 2, 2 at a distance, wherein a reflection film 8 such as an Al film, an Ag film or a Cr film is formed almost all along its inner side face by sputtering or the like. It is also possible to form an insulating film such as an oxide film beneath the reflection film 8.

The through electrodes 2, 2 each pass through the substrate 1 in the thickness direction within the area of the cavity 11 to have one end exposed on one side within the cavity 11 and the other end exposed on the other side of the substrate 1. The through electrodes 2, 2 are a solid column and may have any arbitrary section such as a polygonal shape or a circular shape. The through electrodes 2, 2 may have different planar shapes between a portion passing through the substrate 1 and a portion located on one surface of the substrate 1 and intended to be bonded to the light-emitting element 6. For example, the portion passing through the substrate 1 is shaped to have a polygonal section, a circular section or the like, while the portion intended to be bonded to the light-emitting element 6 is shaped to have an increased plane area. Moreover, the through electrodes 2, 2 preferably have an end face shaped in accordance with an electrode of a light-emitting element 6 to be connected. In the present embodiment, from this viewpoint, one of the through electrodes 2, 2 has a circular end face, while the other has a rectangular end face.

Many columnar heat sinks 3 passing through the substrate 1 in the thickness direction are arranged at a small distance from each other in the form of matrix. The columnar heat sinks 3 are connected together through a heat dissipation layer 31 provided on a back surface (second surface) of the substrate 1. The through electrodes 2, 2 are independent of the heat dissipation layer 31. The heat dissipation layer 31 is not limited to the illustrated film form but may have a three-dimensional structure having an enlarged heat dissipation area.

Figure 13:
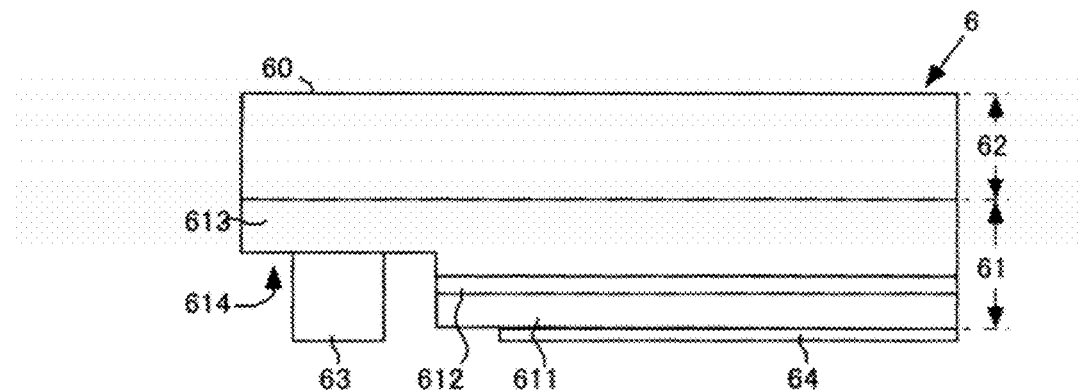
FIG. 13 is a drawing showing an appearance of a light-emitting element used in the light-emitting device shown in FIG. 10.
Figure 14:
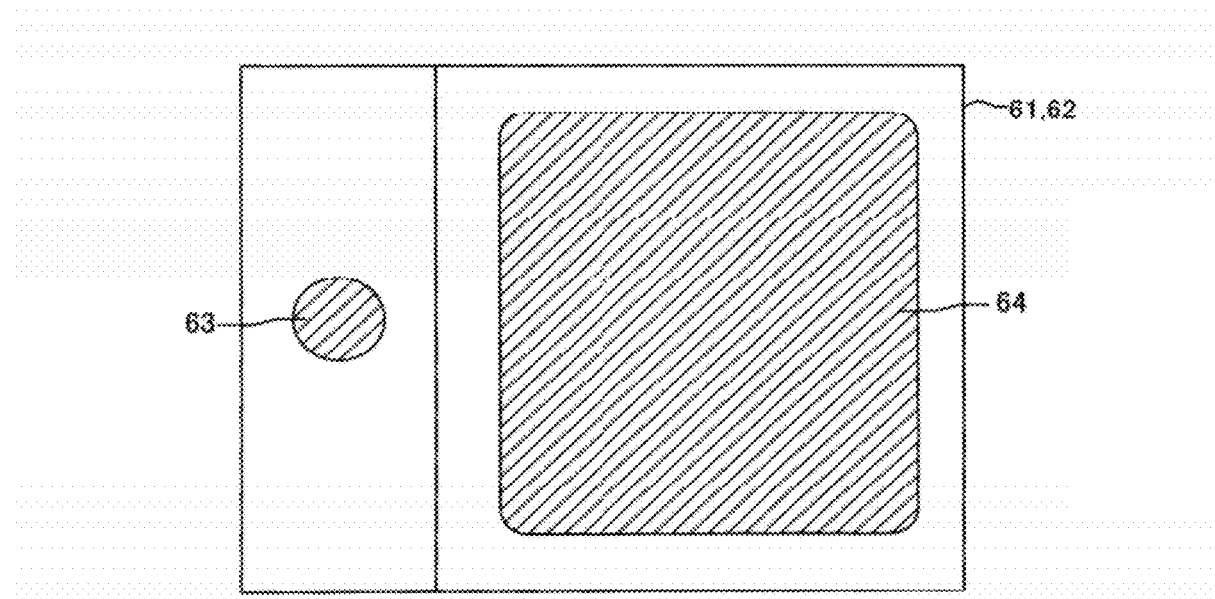
FIG. 14 is a bottom view of the light-emitting element shown in FIG. 13.

The light-emitting element 6 is a light-emitting diode, and the one illustrated in FIGS. 13 and 14 has a semiconductor multilayer structure 61 in which a P-type semiconductor layer 611 and an N-type semiconductor layer 613 are stacked on a surface opposite from a light-emitting surface 60 of a transparent crystal layer 62. Between the P-type semiconductor layer 611 and the N-type semiconductor layer 613 is disposed an active layer 612.

Of the P-type semiconductor layer 611 and the N-type semiconductor layer 613, the N-type semiconductor layer 613 lying closer to the transparent crystal layer 62 has a portion 614 not coinciding with the P-type semiconductor layer 611, and an N-side electrode 63 is disposed on the surface of the noncoinciding portion 614. A P-side electrode 64 is disposed on the surface of the P-type semiconductor layer 611 at a coinciding portion. The N-side electrode 63 is not limited to the circular shape but may have a polygonal shape.

In the present embodiment, the plane area of the N-side electrode 63 disposed on the noncoinciding portion 614 is smaller than that of the P-side electrode 64 disposed on the coinciding portion. Regarding the electrode width as seen in an arrangement direction of the N-side electrode 63 and the P-side electrode 64, more specifically, the N-side electrode 63 has a smaller electrode width than the P-side electrode 64. With the electrodes thus arranged, the width of the noncoinciding portion 614 can be decreased to thereby increase the width and area of the coinciding portion which will serve as a light-emitting area, so that the light emission amount can be increased.

However, FIGS. 13 and 14 show just an example of the light-emitting element 6 applicable to the present invention, and it should not be construed as limitative. For example, it may be constructed such that the transparent crystal layer 62 and the semiconductor multilayer structure 61 are in an upside down relationship. Moreover, the electrode area can be determined in consideration of current diffusion.

As shown in FIG. 10, the light-emitting element 6 is disposed within the cavity 11 of the substrate 1, wherein the P-side electrode 64 of the P-type semiconductor layer 611 is connected to one end of one through electrode 2, while the N-side electrode 63 of the N-type semiconductor layer 613 is connected to one end of the other through electrode 2. When put in the cavity 11, the light-emitting element 6 is disposed with its upper surface lower than the surface of the substrate 1 around the cavity 11. Then, the fluorescent layer 7 is filled therein in such a manner as to eliminate the gap.

The P-side electrode 64 and the N-side electrode 63 are opposed to each other at a distance. Upon bonding the P-side electrode 64 and one through electrode 2 and bonding the N-side electrode 63 and the other through electrode 2, a junction film is interposed at a junction interface between them. The junction film comprises at least one low-melting point metal component selected from the group consisting of Sn, In, Bi Ga and Sb and a high-melting point metal material including at least one component selected from the group consisting of Cr, Ag, Cu, Au, Pt, Pd, Ni, an Ni—P alloy and an Ni—B alloy. Since the low-melting point metal can be consumed by reacting with the P-side electrode 64 and one through electrode 2 or the N-side electrode 63 and the other through electrode 2 and forming an intermetallic compound, the melting point increases considerably after the bonding.

Typically, the transparent crystal layer 62 comprises sapphire and its one side becomes the light-emitting surface 60. A buffer layer (not shown) lies on one side of the transparent crystal layer 62, and the semiconductor multilayer structure 61 is grown over the transparent crystal layer 62 with the buffer layer therebetween.

The semiconductor multilayer structure 61 is well-known regarding the light-emitting element 6. It has a PN junction and typically comprises a III-V group compound semiconductor. However, it is not limited to the known art but can comprise any compound semiconductors that may be suggested in future.

In the present invention, the light-emitting element 6 may be any one of red, green, blue and orange light-emitting elements or a white light-emitting element. Semiconductor materials for constituting the semiconductor multilayer structure 61 in these light-emitting elements and their manufacturing methods are well known in the art.

In the illustrated light-emitting device, the substrate 1 includes two through electrodes 2, 2 and has the cavity 11 at one side thereof. The through electrodes 2, 2 each pass through the substrate 1 in the thickness direction to have one end exposed on one side within the cavity 11. The light-emitting element 6 is disposed within the cavity 11 of the substrate 1. In the present embodiment, the light-emitting element 6 is constructed such that the P-type semiconductor layer 611 and the N-type semiconductor layer 613 are stacked on the second surface opposite from the first surface 60 which will become the light-emitting surface of the transparent crystal layer 62. Inside the cavity 11, moreover, the P-side electrode 64 of the P-type semiconductor layer 611 is connected to one end of one through electrode 2, while the N-side electrode 63 of the N-type semiconductor layer 613 is connected to one end of the other through electrode 2. According to the present embodiment, therefore, current can be supplied to the light-emitting element 6 from the side opposite from the side having the transparent crystal layer 62, thereby realizing a structure in which the electrodes for the light-emitting element 6 do not appear on the light-emitting surface 60. Thus, produced light can be efficiently emitted to the outside.

The substrate 1 includes many columnar heat sinks 3. The columnar heat sinks 3 are provided to extend in the thickness direction of the substrate 1. Accordingly, heat generated by the light emitting operation of the light-emitting element 6 can be dissipated to the outside of the substrate 1 through the columnar heat sinks 3, keeping the bonding strength at the junction where the electrodes 63, 64 of the light-emitting element 6 are connected to the through electrodes 2, 2 and maintaining the reliability of electrical connection. Moreover, a variation in light-emitting characteristics of the light-emitting element 6 due to the heat generation can be avoided.

The columnar heat sink 3 has one end led to the second surface of the substrate 1 and connected to the heat dissipation layer 31 provided on the second surface of the substrate 1. With this structure, the heat dissipation characteristics can be further improved.

In the present embodiment, the reflection film 8 is provided between the inner surface of the cavity 11 and the side face of the light-emitting element 6. Therefore, light produced at the semiconductor layer 61 can be led to the light-emitting surface 60 of the transparent crystal layer 62 while suppressing light scattering and absorption due to the transparent crystal layer 62.

The reflection film 8 may be adhered to the inner surface of the cavity 11 or adhered to the side face of the light-emitting element 6. In the embodiment shown in FIGS. 10 to 12, the light-emitting element 6 is fitted in the cavity 11 with a small clearance. With this structure, positioning and setting of the light-emitting element 6 with respect to the substrate 1 can be performed easily and reliably.

Although not illustrated, the light-emitting surface 60 may have a transparent optical component having small irregularities. This enables the light-emitting surface 60 to diffuse or disperse light, achieving uniform surface light emission. Instead of providing the transparent optical component, it is also possible to form the light-emitting surface 60 with small irregularities. Although not illustrated, furthermore, the light-emitting surface 60 may have a fluorescent body along with or without the small irregularities.

Figure 15:
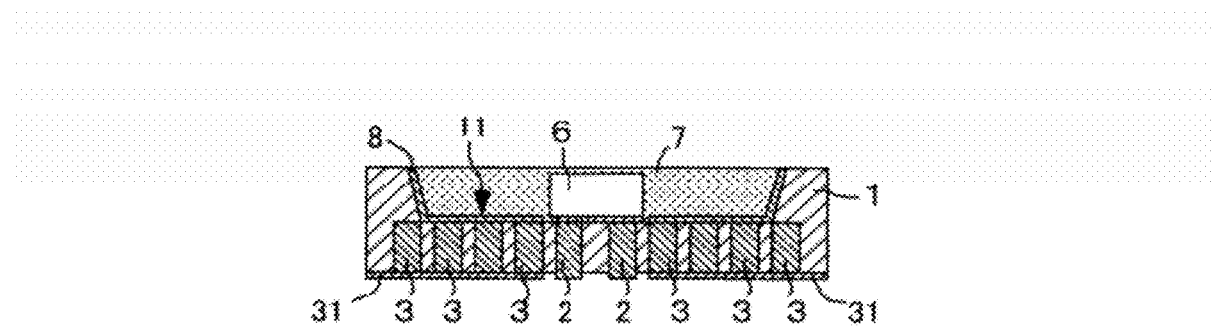
FIG. 15 is a partial sectional view showing another embodiment of a light-emitting device according to the present invention.

Referring further to FIG. 15, there is illustrated a light-emitting device whose cavity 11 has an increased plane area as compared with the embodiment shown in FIGS. 10 to 12. The cavity 11 is considerably larger than the plane area of the light-emitting element 6, wherein the fluorescent layer 7 or the like is filled in a space between the periphery of the light-emitting element 6 and the inner wall surface of the cavity 11. Moreover, the reflection film 8 is adhered to the inner wall surface of the cavity 11. The columnar heat sink 3 has one end (upper end) terminated at almost the same height as the bottom face of the cavity 11 and the other end led to the back surface of the substrate 1 and connected to the heat dissipation layer 31.

Figure 16:
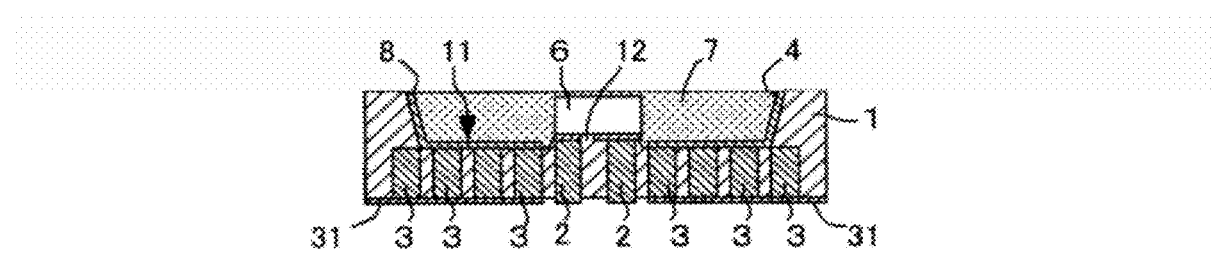
FIG. 16 is a partial sectional view showing still another embodiment of a light-emitting device according to the present invention.

Referring to FIG. 16, there is illustrated a light-emitting device having almost the same structure as that of FIG. 15, wherein a protrusion 12 is provided at the center of the cavity 11 and the light-emitting element 6 is mounted on the protrusion 12. The embodiments of FIGS. 15 and 16 also have the effects described with reference to FIGS. 10 to 13.

The light-emitting device according to the present invention has numerous uses such as a light-emitting diode being a single light-emitting element, a surface light-emitting device having a plurality of light-emitting elements arranged, for example, in the form of matrix, a lighting apparatus, a backlight for a liquid crystal display, a signal light and so on. Their examples will be described below.

Figure 17:
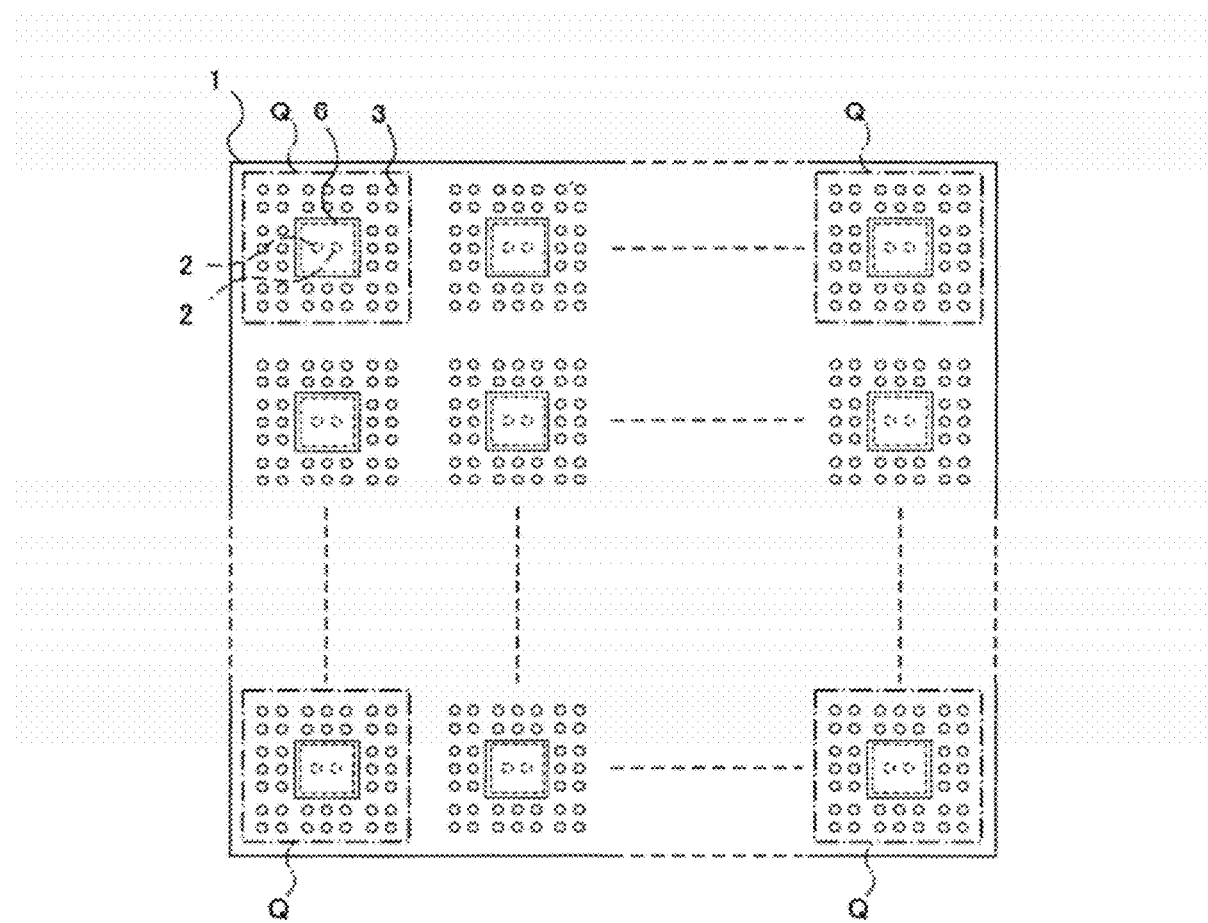
FIG. 17 is a plan view of a lighting apparatus according to the present invention.

FIG. 17 is a plan view of a lighting apparatus having a light-emitting diode. The illustrated lighting apparatus has a rectangular substrate 1 and a plurality of light-emitting devices Q arranged on the substrate 1 in the form of matrix.

The light-emitting devices Q each have a light-emitting element 6 for emitting a light of a given hue, two through electrodes 2, 2 for electrical connection of the light-emitting element 6 and many columnar heat sinks 3 arranged around the light-emitting element 6. Each light-emitting element 6 is disposed within a cavity 11 formed in the substrate surface of a substrate 1. The shape of the substrate 1, the number and arrangement of the light-emitting devices Q and the number and arrangement of the columnar heat sinks 3 are not limited to the embodiment shown in FIG. 17 but can be determined as appropriate.

Figure 18:
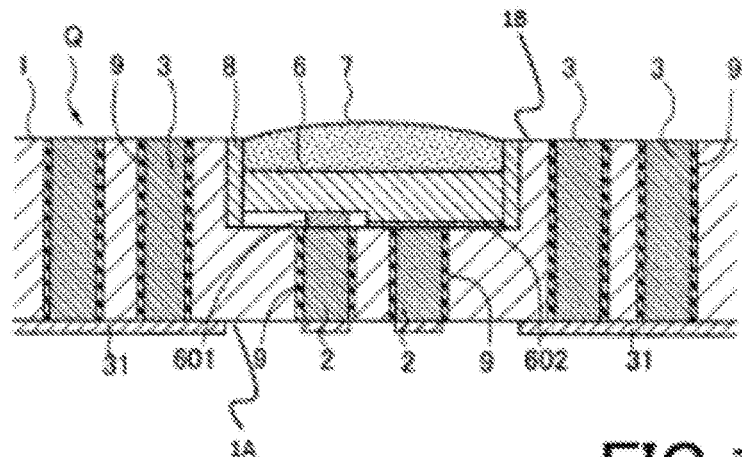
FIG. 18 is an enlarged sectional view showing a part of the lighting apparatus shown in FIG. 17.
Figure 19:
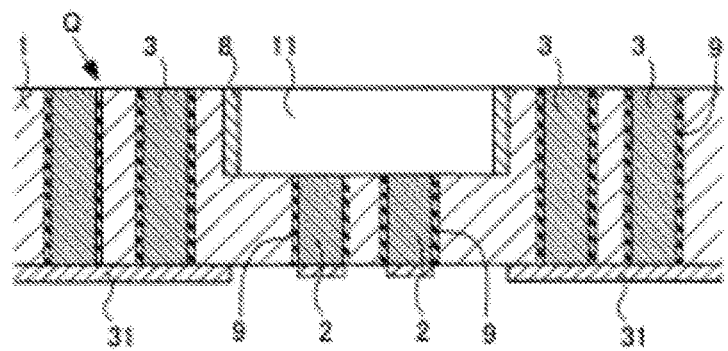
FIG. 19 is a sectional view from which a light-emitting element and a fluorescent body shown in the sectional view of FIG. 18 are removed.
Figure 20:
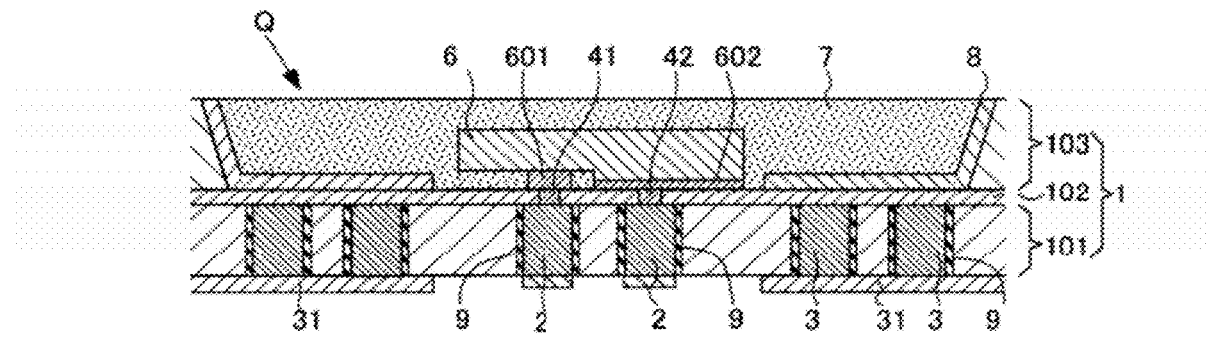
FIG. 20 is a sectional view of light-emitting device according to another embodiment.
Figure 21:
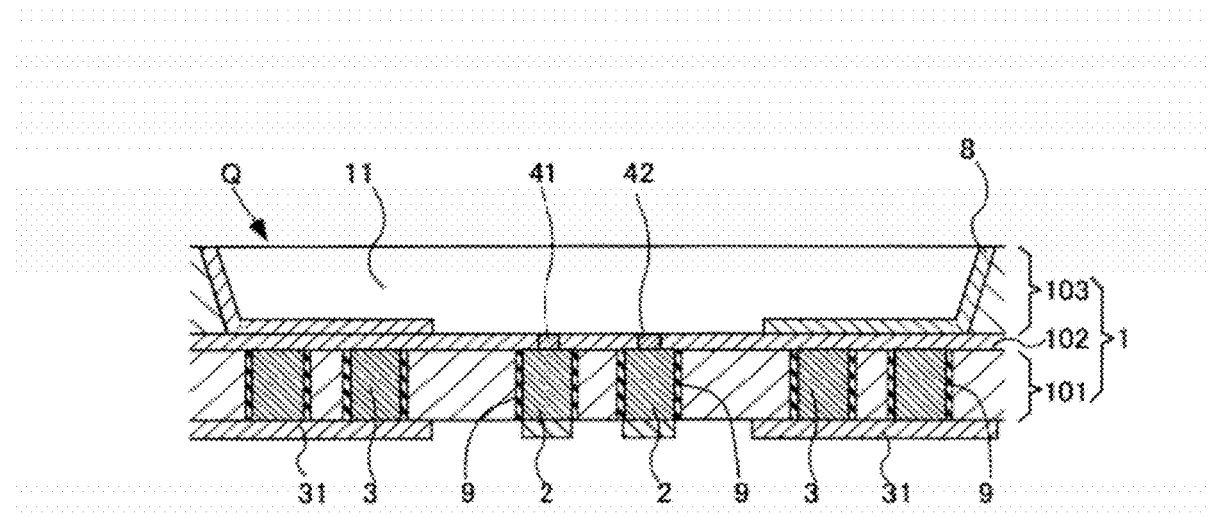
FIG. 21 is a sectional view from which a light-emitting element and a fluorescent body shown in the sectional view of FIG. 20 are removed.

The above-described light-emitting devices Q are shown in more detail in FIGS. 18 to 20. The substrate 1 serves as a so-called package, including a plurality of through electrodes 2 and a plurality of columnar heat sinks 3 and having cavities 11 in its substrate surface. For the substrate 1, it is preferable to use a substrate including Si as a main component, but it is not limited thereto and an insulating resin substrate or an insulating ceramic substrate may also be used. Furthermore, it may be a conductive substrate such as a metal substrate. In the present embodiment, description will be made concerning the case where the substrate 1 is an Si substrate.

The shape of the cavity 11 of the substrate 1 is not limited to the cuboid shape shown in FIG. 17, but it may have other shapes. The cavity 11 is formed to surround the through electrodes 2, 2 at a distance as seen in plan, wherein a reflection film 8 is formed almost all along its inner side face by sputtering or the like. The reflection film 8 is not limited to the above embodiment but may be adhered to the side face of the light-emitting element 6, for example, and it is also possible to form an insulating film such as an oxide film beneath the reflection film 8.

The light-emitting element 6 is fitted in the cavity 11 with a small clearance. With this structure, positioning and setting of the light-emitting element 6 with respect to the substrate 1 can be performed easily and reliably. Moreover, the upper surface of the light-emitting element 6 within the cavity 11 is covered with the fluorescent layer 7. This improves the luminance of light emitted from the light-emitting element 6. Examples of fluorescent materials to be used for the fluorescent layer 7 include calcium phosphate. The hue of the fluorescent layer 7 may be determined as appropriate depending on the intended use.

The through electrodes 2, 2 each pass through the substrate 1 in the thickness direction in the bottom face of the cavity 11 to have one end exposed on one side within the cavity 11 and the other end exposed on the other side of the substrate 1. The through electrodes 2, 2 may have an end face shaped in accordance with an electrode of the light-emitting element 6 to be connected, and in this case, the through electrodes 2, 2 have a circular end face and a rectangular end face, respectively.

In the present embodiment, since the substrate 1 is a conductive Si substrate, the through electrodes 2, 2 are electrically insulated from the substrate 1. As a means for electrical insulation, an electrical insulating layer 9 is provided between the periphery of the through electrodes 2, 2 and the inner wall surface of the vias containing the through electrodes 2, 2. The electrical insulating layer 9 may be an oxide film or a nitride film obtained by oxidizing or nitriding the inner wall surface of the via in the substrate 1 being an Si substrate or a layer of an organic insulating material or an inorganic insulating material such as glass filled into the via.

Many columnar heat sinks 3 passing through the substrate 1 in the thickness direction are arranged at a small distance from each other in the form of matrix and connected to the heat dissipation layer 31 provided on the back surface (second surface) of the substrate 1. Thus, the columnar heat sinks 3 can effectively dissipate heat from the substrate 1.

The heat dissipation layer 31 comprises a material having a relatively high thermal conductivity such as aluminum and can be disposed on the back surface of the substrate 1 as a plurality of separate members or as a single member to be connected in common to all the heat sinks 3. Furthermore, the heat dissipation layer 31 is not limited to the illustrated film form but may have a three-dimensional structure having an increased heat dissipation area.

FIG. 20 shows another embodiment of the light-emitting devices Q. The difference between the light-emitting device according to the present embodiment and the foregoing embodiment resides in that the substrate 1 comprises three layers 101 to 103 and that the cavity 11 has an increased plane area.

In the present embodiment, the substrate 1 is an SOI substrate constructed by stacking a first silicone layer 101 comprising a first substrate layer, an oxide layer 102 comprising an insulating layer, and a second silicon layer 103 comprising a second substrate layer in the mentioned order.

The cavity 11 is formed by cutting off the surface of the second silicon layer 103 and has an inner side face which is inclined to increase the opening area toward the open end. The cavity 11 has a considerably larger plane area than the light-emitting element 6, wherein the fluorescent layer 7 is filled in a space between the periphery of the light-emitting element 6 and the inner wall surface of the cavity 11. Moreover, the reflection film 8 is adhered to the inner wall surface of the cavity 11 as in the foregoing embodiment.

The through electrodes 2, 2 pass through the first silicon layer 101 in an electrically insulated state because of the electrical insulating layer 9 and have their cavity 11-side ends connected to connections 41, 42 passing through the oxide layer 102, respectively. The connections 41, 42 are connected to two terminals 601, 602 of the light-emitting element 6. The connections 41, 42 are not limited to a cylindrical shape but may have other shapes such as a square pole shape.

The columnar heat sinks 3 are provided to pass through the first silicone layer 101 in the thickness direction of the substrate 1 in the same manner as the through electrodes 2, 2 and connected to the heat dissipation layer 31. That is, the columnar heat sinks 3 are provided to extend from the back surface of the substrate 1 to the interface between the first silicon layer 101 and the oxide layer 102. With this structure, the oxide layer 102 can serve as an etching blocking layer during formation of the columnar heat sinks 3. This leads to an advantage that the etching process can be controlled extremely easily because the height of the columnar heat sink 3 can be defined by the film thickness of the first silicon layer 101.

The above-described lighting apparatus includes the substrate 1, and the substrate 1 includes many columnar heat sinks 3. Since the columnar heat sinks 3 are provided to extend in the thickness direction of the substrate 1, heat generated by the light emitting operation of the light-emitting element 6 can be dissipated to the outside of the substrate 1 through the columnar heat sinks 3, keeping the bonding strength at the junction where the terminals 601, 602 of the light-emitting element 6 are connected to the through electrodes 2, 2 and maintaining the reliability of electrical connection, and also avoiding a variation in light-emitting characteristics of the light-emitting element 6 due to the heat generation.

Since the columnar heat sink 3 has one end led to the second surface of the substrate 1 and connected to the heat dissipation layer 31 provided on the second surface of the substrate 1, the heat dissipation characteristics of the substrate 1 can be further improved.

The light-emitting element 6 is the one shown in FIGS. 13 and 14. Therefore, current can be supplied to the light-emitting element 6 from the side opposite from the transparent crystal layer 62 in the stacking direction, thereby realizing a structure in which the terminals 601, 602 of the light-emitting element 6 do not appear on the light-emitting surface, so that produced light can be efficiently emitted to the outside. Moreover, the light produced at the semiconductor layer 61 can be effectively led to the light-emitting surface of the transparent crystal layer 62 because the reflection film 8 can suppress light scattering and absorption due to the transparent crystal layer 62.

Figure 22:
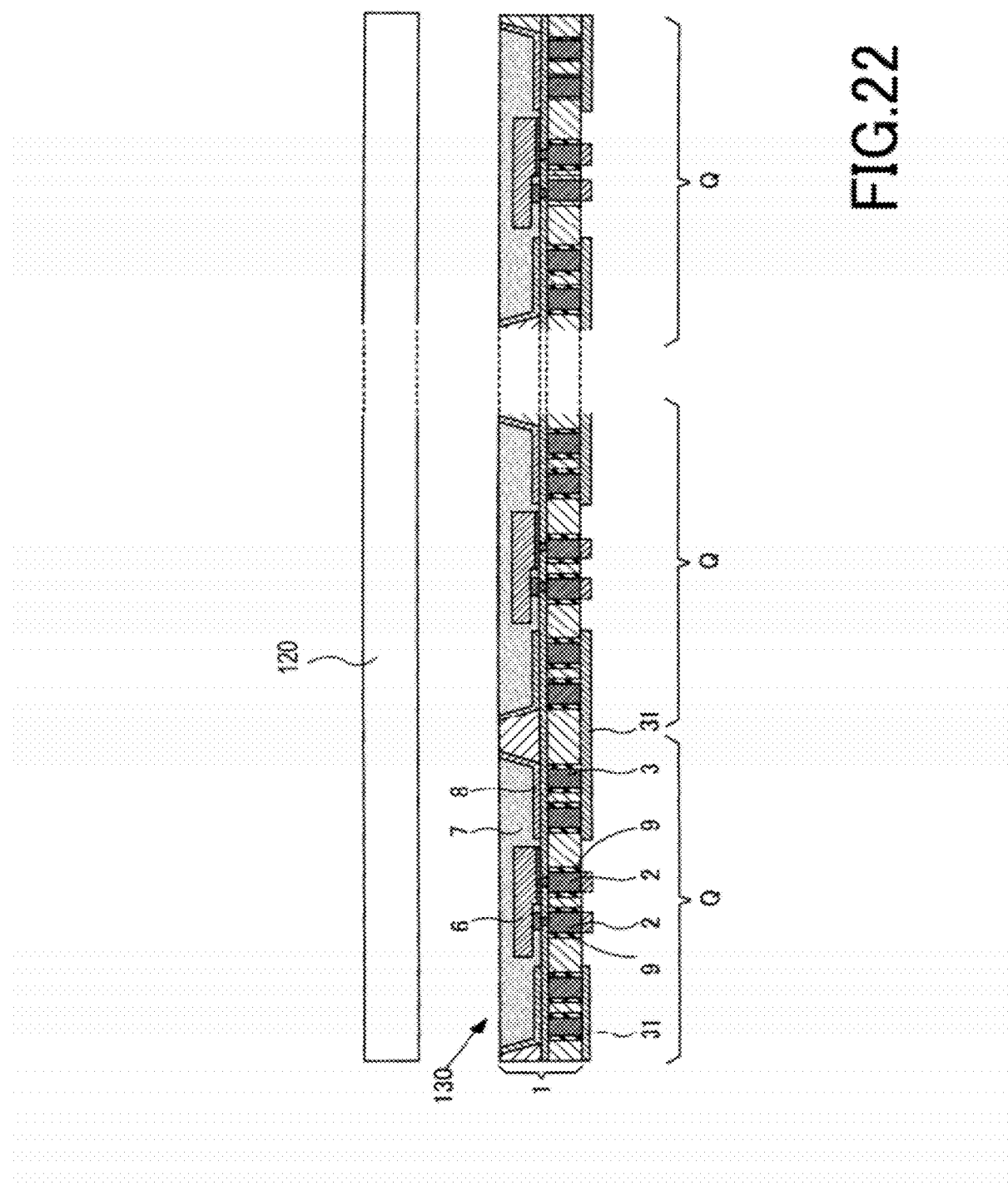
FIG. 22 is a sectional view of a liquid crystal display according to the present invention.

Next will be described a liquid crystal display according to the present invention with reference to FIG. 22. The liquid crystal display includes a liquid crystal panel 120 and a backlight 130. Conceptually, this liquid crystal display is not limited to a common display device for computers or a liquid crystal display for general-purpose appliances but can also be used for a liquid crystal television or a portable electronic device such as a mobile phone, a handheld game console or a personal digital assistant.

The liquid crystal panel 120 is a liquid crystal module comprising a polarizing filter, a glass substrate, a liquid crystal layer and so on and driven by electrical signals from a driving circuit (not shown) based on image signals. The backlight 130 is the lighting apparatus shown in FIGS. 17 to 21 and illuminates the liquid crystal panel 120 from the back side with a plurality of the light-emitting devices Q. However, the backlight 130 is not limited to this embodiment and, for example, may be the lighting apparatus shown in FIGS. 10 to 16, and it goes without saying that any type of lighting apparatus according to the present invention can be used.

In the backlight 130, the through electrodes 2, 2 are connected to a power supply through a bump electrode and a wiring substrate, whereby the light-emitting element 6 supplied with power can irradiate light to the liquid crystal panel 120. On the other hand, the columnar heat sinks 3 are connected to the heat dissipation layer 31 so as to expel heat inside the substrate 1 toward the back surface of the liquid crystal display.

The liquid crystal display according to the present invention also has the foregoing effects because of including the above-described lighting apparatus.

Next will be described a light-emitting diode display according to the present invention with reference to FIGS. 23 and 24. Since the light-emitting diode display uses the light-emitting element itself as a pixel, it does not need a backlight and therefore has the advantage of being able to reduce power consumption.

Figure 23:
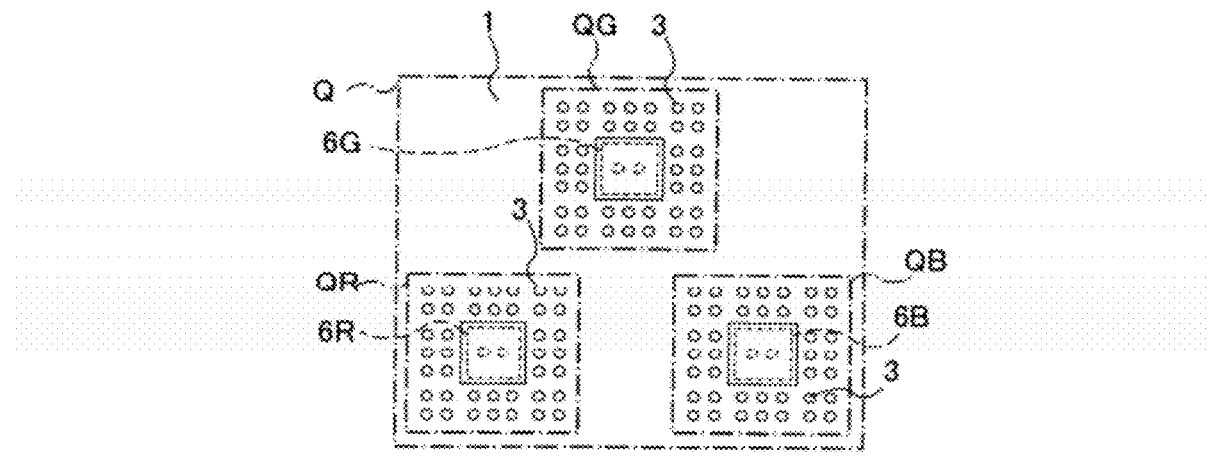
FIG. 23 is a plan view of a pixel.
Figure 24:
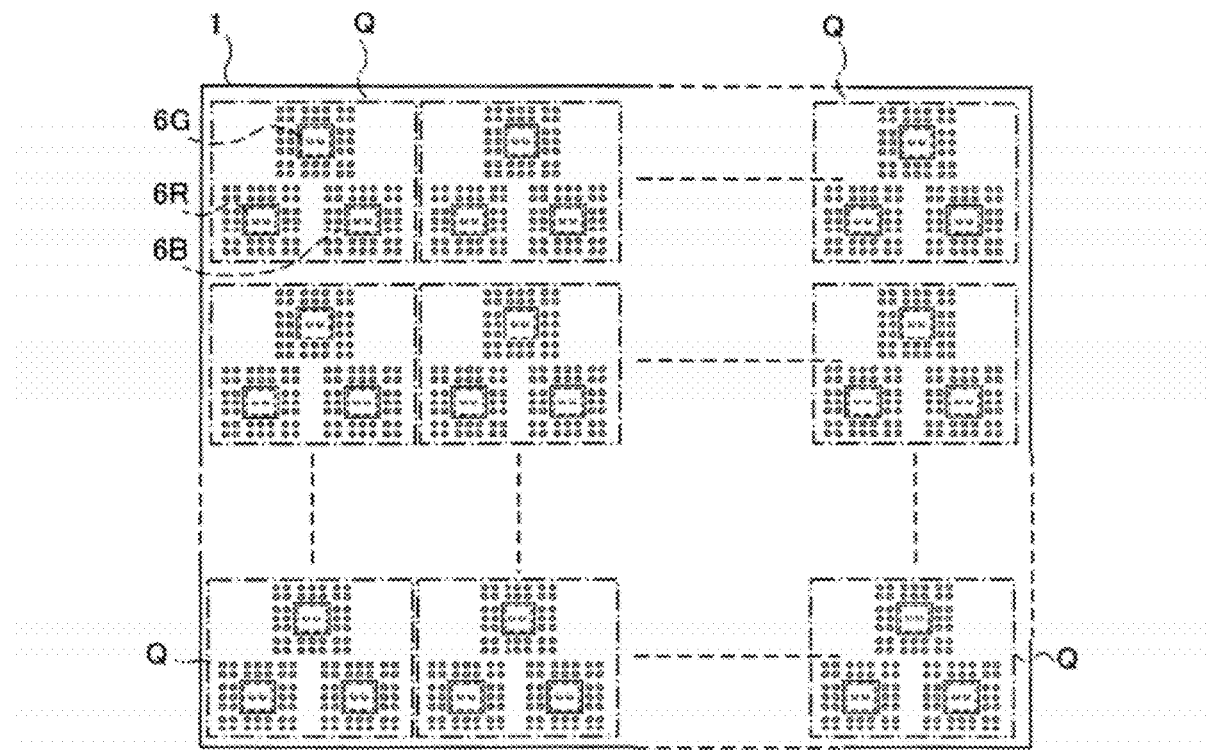
FIG. 24 is a plan view of a light-emitting diode display according to the present invention.

FIG. 23 shows a pixel Q of the light-emitting diode display as seen in plan, while FIG. 24 shows the light-emitting diode display in which the pixels Q are arranged in the form of matrix on the substrate 1.

The single pixel Q has three light-emitting devices QR, QG, QB, wherein these light-emitting devices QR, QG, QB have a light-emitting element 6R for emitting a red light, a light-emitting element 6G for emitting a green light and a light-emitting element 6B for emitting a blue light, respectively. The light-emitting diode display according to the present embodiment is intended to be a full-color display and therefore includes the light-emitting elements 6R, 6G, 6B for three colors, but it is not limited thereto. If it is intended to be a single-color display, for example, the pixel Q may include only one of the light-emitting elements 6R, 6G, 6B for three colors. That is, the pixel Q can be constructed by appropriately selecting the light-emitting devices QR, QG, QB having a light-emitting element based on its display function.

In the pixel Q of the present embodiment, moreover, the three light-emitting devices QR, QG, QB are located at vertexes of a triangle as illustrated, but they are not limited thereto and may be arranged as appropriate depending on the characteristics of the light-emitting elements 6R, 6G, 6B for three colors.

In the light-emitting diode display according to the present invention, the through electrodes 2, 2 of each light-emitting element 6R, 6G, 6B are connected to a thin-film transistor (TFT) or the like, whereby light emission of each pixel Q is controlled by a driving circuit depending on image signals. On the other hand, the columnar heat sinks 3 are connected to the heat dissipation layer 31 so as to expel heat inside the substrate 1 toward the back surface of the display, as in the structure shown in FIGS. 18 to 23.

The light-emitting diode display according to the present invention also has the foregoing effects because of having the same structure as the above-described lighting apparatus.

On the other hand, the signal light according to the present invention is intended for use in a railroad signal or a traffic light, for example, and constructed by arranging many light-emitting devices QR, QG, QB to have the light-emitting elements 6R, 6G, 6B, for example, for two or more colors, as in the above-described light-emitting diode display.

The signal light according to the present invention also has the foregoing effects because of having the same structure as the above-described lighting apparatus.

Figure 25:
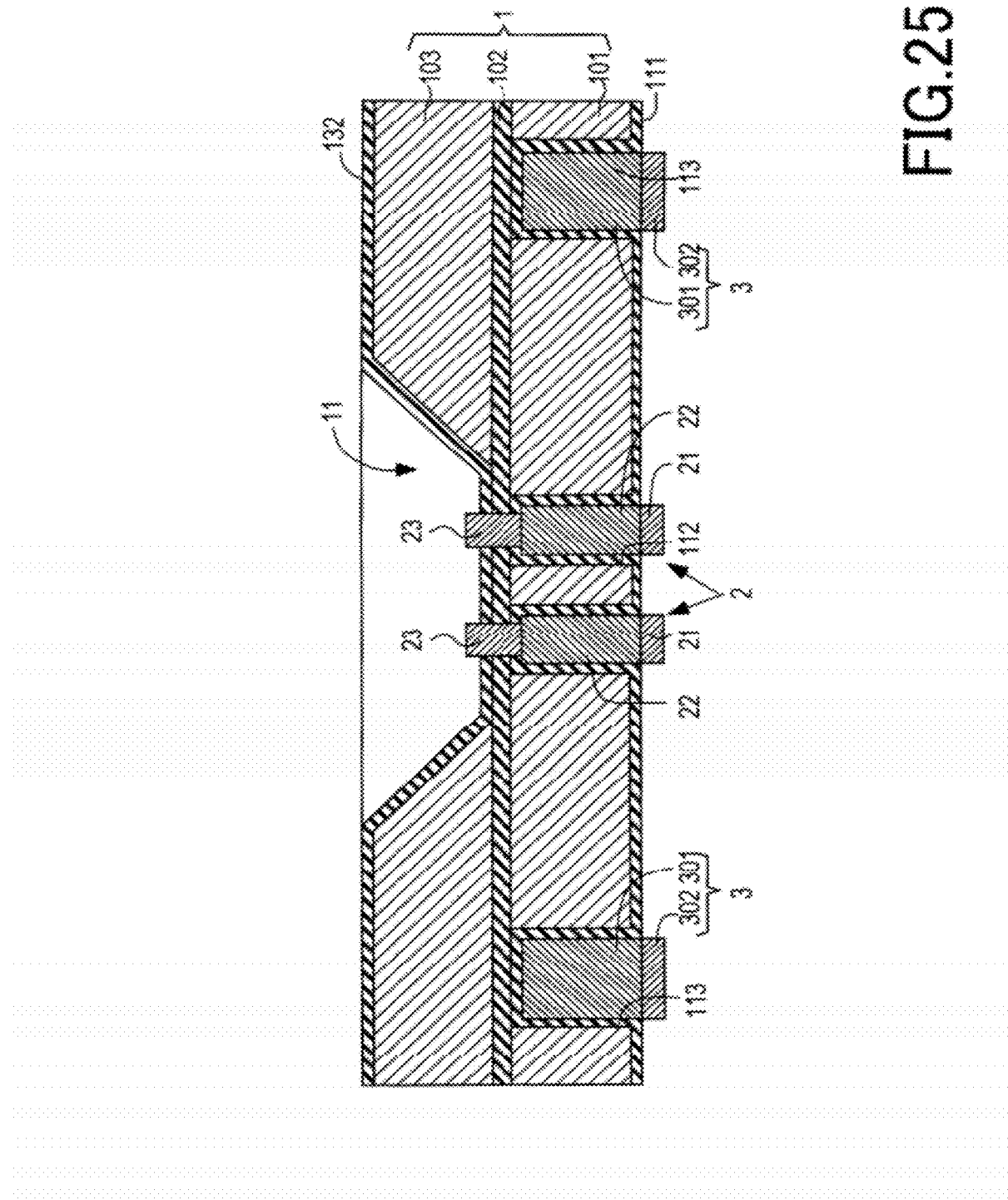
FIG. 25 is a sectional view showing another embodiment of a substrate according to the present invention.

The substrate 1 shown in FIG. 25 has the through electrodes 2, the columnar heat sinks 3 and the cavity 11. In the present embodiment, the illustrated substrate 1 is an SOI substrate constructed by stacking a first silicone layer 101 comprising a first substrate layer, an oxide layer 102 comprising an insulating layer, and a second silicon layer 103 comprising a second substrate layer in the mentioned order.

Regarding the manufacturing method, there have been known two types of SOI substrate: SIMOX (separation by implantation of oxygen)-type and wafer bonding-type. Any type of SOI substrate can be used. For the SIMOX-type SOI substrate, there has been known a technique of forming an insulating layer of oxidized silicon within a silicon crystal by burying oxygen molecules from the silicon crystal surface using ion implantation and then oxidizing it at a high temperature. Such an insulating layer is referred to as buried oxide (BOX) layer.

The cavity 11 is a portion to which an electronic element is to be attached and formed in the surface of the second silicon layer 103. The illustrated cavity 11 is formed by cutting off the center of the second silicon layer 103 in a rectangular shape and has an inner side face which is inclined to increase the opening area toward the open end. The second silicon layer 103 and the inner surface of the cavity 11 are covered with an insulating layer 132. The insulating layer 132 may be a silicon oxide film or a silicon nitride film.

The through electrode 2 passes through the first silicone layer 101 and the oxide layer 102 and is exposed with one end projecting slightly from the bottom face of the cavity 11. More specifically, the through electrode 2 comprises a terminal portion (bump) 21 to be used as a connection to the outside, a through portion 22 passing through the first silicone layer 101 and an element-connecting portion 23 to be connected to a terminal electrode of an electronic element. The terminal portion 21 is adhered to one end face of the through portion 22 and may be an electroless plating film such as of Ti—Au.

In the embodiment where the SOI substrate is used as the substrate 1, an insulating film 111 is provided between the first silicone layer 101 and the through electrode 2 and on the surface of the first silicone layer 101. The insulating film 111 may be a silicon oxide film or a silicon nitride film.

One end of the element-connecting portion 23 is adhered to one end of the through portion 22, while the other end passes through the insulating film 111, the oxide layer 102 and the insulating layer 132 adhered to the bottom face of the cavity 11 and projects into the cavity 11 for exposure. The element-connecting portion 23 may also be an electroless plating film such as of Ti—Au as with the terminal portion 21.

On the other hand, the columnar heat sinks 3 are each filled in a via 113 formed in the thickness direction of the first silicon layer 101. The columnar heat sink 3 comprises a columnar portion 301 being a main part and a terminal portion 302 adhered to one end face thereof. The terminal portion 302 may be an electroless plating film such as of Ti—Au as with the terminal portion 21. The vias 113 having the columnar portion 301 are provided to pass through the first silicone layer 101 and terminate at the interface between first silicone layer 101 and the oxide layer 102 and are distributed around the cavity 11 to have a given occupancy rate as the substrate 1 is seen in plan.

Between the columnar heat sink 3 and the first silicone layer 101, there is provided the insulating film 111 being a silicon oxide film or a silicon nitride film.

Figure 26:
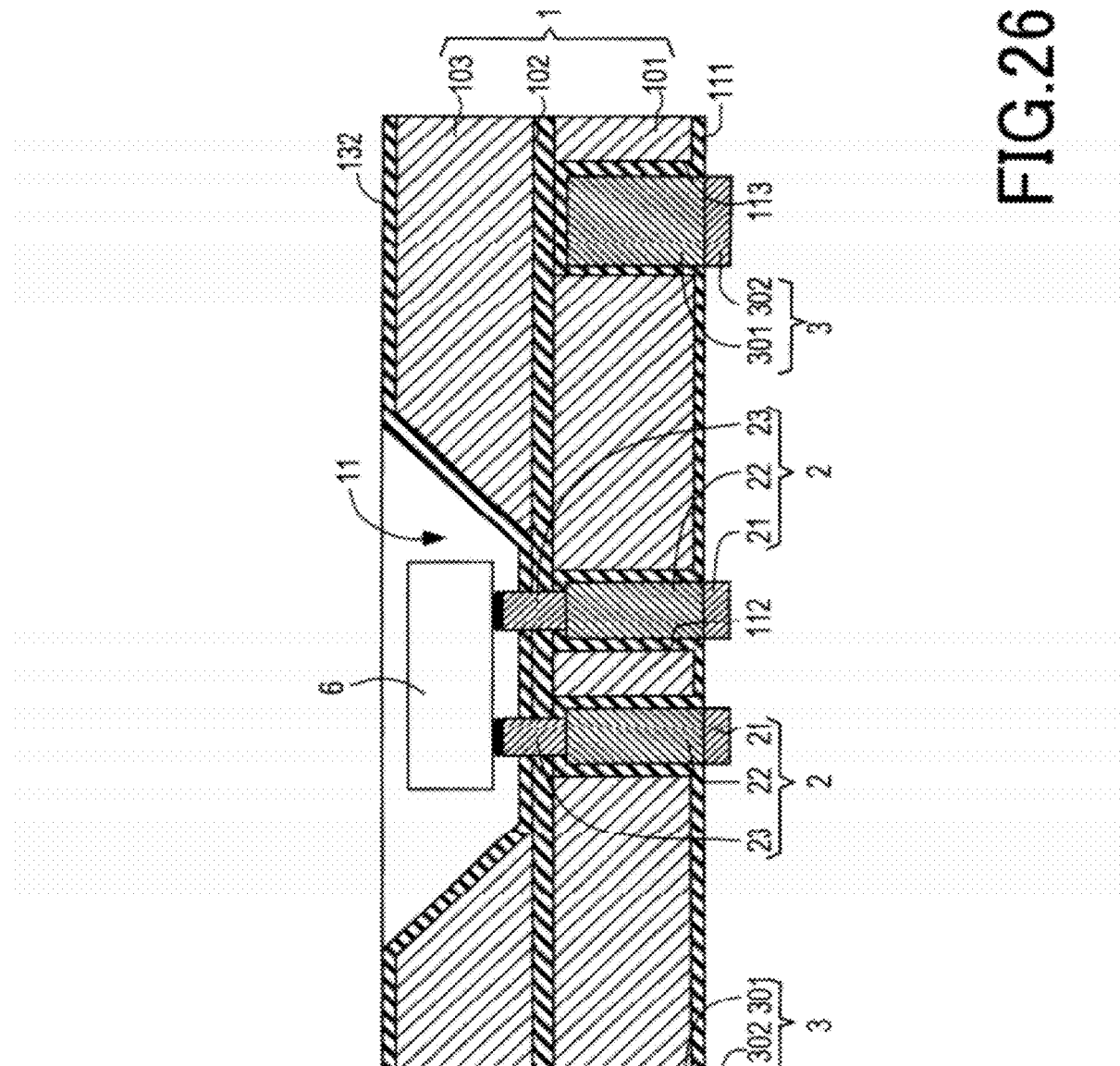
FIG. 26 is a partial sectional view of an electronic device having the substrate shown in FIG. 25.

Referring to FIG. 26, there is illustrated a light-emitting device having the substrate 1 shown in FIG. 25. In this light-emitting device, a light-emitting element (LED) 6 being an electronic element is disposed in the cavity 11 of the circuit substrate. The light-emitting element 6 has an electrode bonded to the element-connecting portion 23 of the through electrode 2. Although not illustrated, the insulating layer 132 inside the cavity 11 is preferably provided with a light reflection film.

Here, the substrate 1 has the cavity 11 and the through electrodes 2, the cavity 11 is formed in the surface of the second silicon layer 103, and the through electrode 2 passes through the first silicon layer 101 and the oxide layer 102 to have one end exposed on the bottom face of the cavity 11. Therefore, the light-emitting element 6 being an electronic element can be disposed within the cavity 11 of the circuit substrate and the electrode provided on one surface of the light-emitting element 6 can be bonded to the element-connecting portion 23 forming one end of the through electrode 2. Thus, the light-emitting element 6 can be connected to the through electrode 2 by a flip chip bonding process.

Furthermore, the circuit substrate according to the present invention includes the columnar heat sink 3, and the columnar heat sink 3 is filled in the via 113. The via 113 passes through the first silicon layer 101. Accordingly, heat generated by the operation of the light-emitting element 6 can be dissipated to the outside of the substrate 1 through the columnar heat sinks 3, keeping the bonding strength at the portion where the light-emitting element 6 is bonded to the through electrode 2 and maintaining the reliability of electrical connection. Moreover, a variation in electrical characteristics of the light-emitting element 6 due to the heat generation can be avoided.

The via 113 is provided to pass through the first silicon layer 101 and terminate at the interface between the first silicon layer 101 and the oxide layer 102. With this structure, the oxide layer 102 can serve as an etching blocking layer during formation of the via 113. This makes it extremely easy to control the depth of the via 113 because the depth of the via 113 has a uniform value defined by a depth from the first silicon layer 101 to the oxide layer 102, i.e., the film thickness of the first silicon layer 101.

The vias 113 are distributed around the cavity 11 to have a given occupancy rate as the substrate 1 is seen in plan. This means that a heat dissipation area is formed to surround the electronic element housed in the cavity 11, i.e., the light-emitting element 6 with the columnar heat sinks 3, so that heat generated at the light-emitting element 6 can be collected and dissipated efficiently.

Moreover, heat generated by the operation of the light-emitting element 6 can be efficiently dissipated to the outside of the substrate 1 through the columnar heat sinks 3 by properly selecting the thermal conductivity of the material constituting the columnar heat sinks 3 and the occupancy rate of the columnar heat sinks 3.

Embodiment 2

Electronic Device or Electronic Equipment

The electronic element is not limited to the foregoing light-emitting element 6 but may be an active element, a passive component or a composite element thereof. It may also be one having the above-described various types of elements arranged into a three-dimensional multilayer structure based on the TSV technology or one having an interposer and the various types of elements combined into a three-dimensional multilayer structure.

Figure 27:
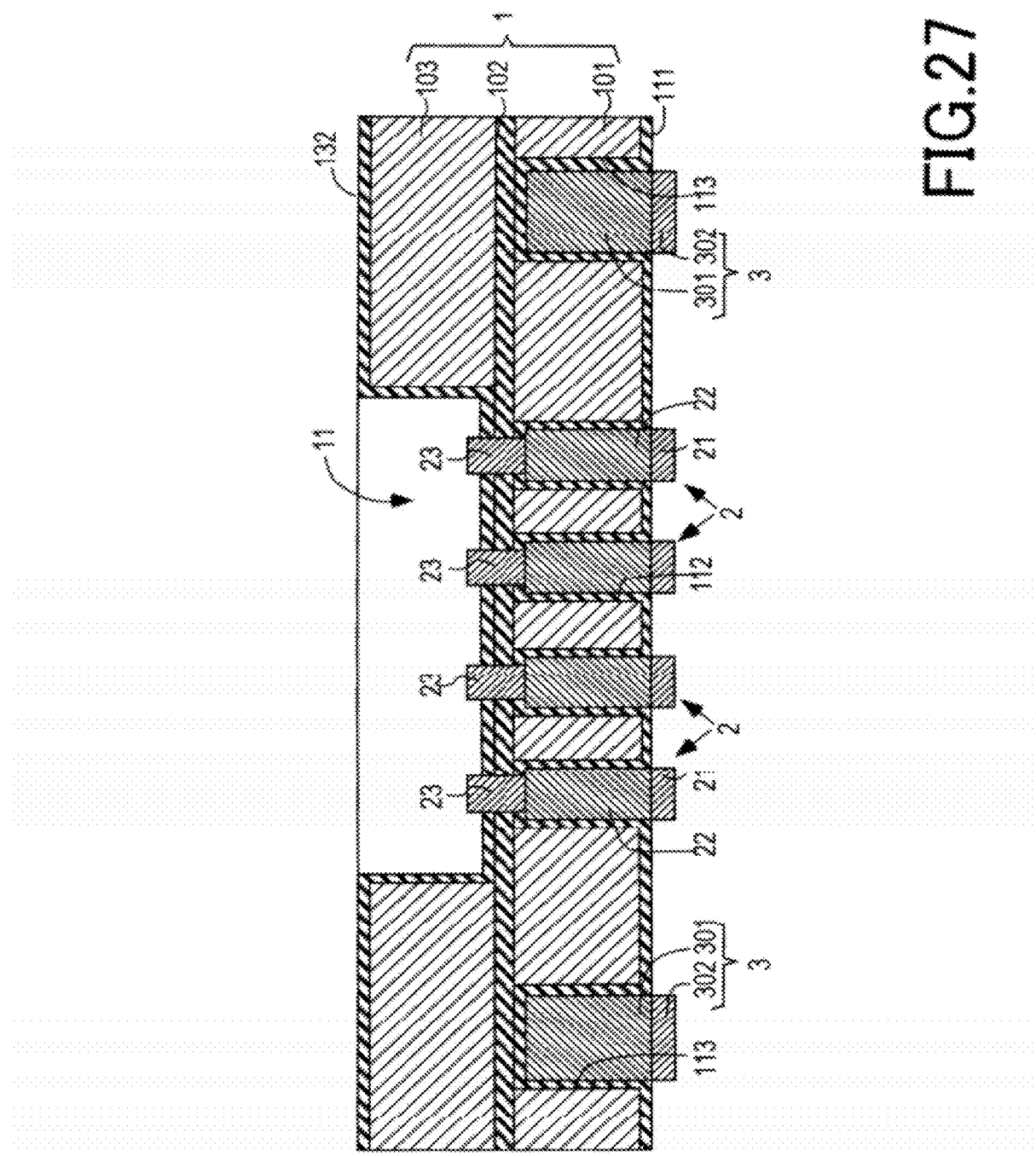
FIG. 27 is a partial sectional view showing another embodiment of a substrate according to the present invention.

Referring to FIG. 27, there is illustrated a circuit substrate suitable for mounting such an electronic element. In this figure, the components identical or similar to those illustrated in the foregoing figures are denoted by the same reference symbols. In FIG. 27, the number of through electrodes 2 is increased in accordance with the number of terminal electrodes of an electronic element to be mounted within the cavity 11. In addition, the cavity 11 has an inner side face extending substantially vertically.

Figure 28:
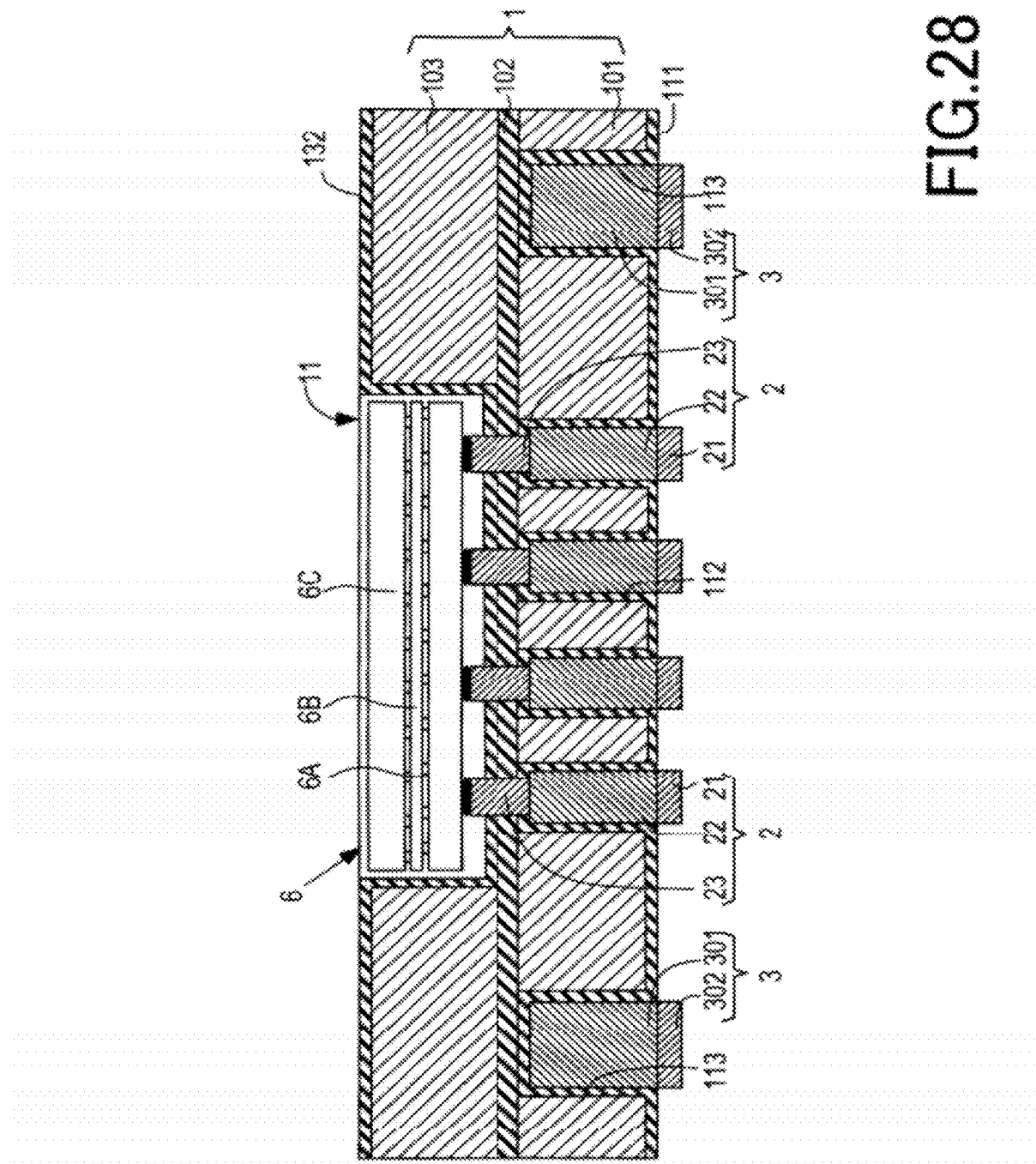
FIG. 28 is a partial sectional view of an electronic device having the substrate shown in FIG. 27.

FIG. 28 shows an electronic device in which an electronic element 6 is incorporated into the circuit substrate shown in FIG. 27. The electronic element 6 has a three-dimensional multilayer structure based on the TSV technology, wherein a logic element 6A such as an LSI and a memory element 6C such as a DRAM are stacked and bonded through an interposer 6B. Electronic devices of this type can be used as a basic element of an information processing system. More specifically, they can be used as a component of an image processing system in a personal digital assistant, a mobile phone, a digital appliance, a server or the like. There are other uses, including an image sensor module.

The logic element 6A is a so-called logic IC, and its electrodes provided on one side are bonded to the element-connecting portions 23 of the through elements 2 provided in the substrate 1. The logic element 6A is in the form of a chip containing a semiconductor logic circuit such as an LSI. The logic element 6A may have a three-dimensional multilayer structure in which the embedded semiconductor logic circuit is led to the electrodes based on the TSV technology.

The interposer 6B has a plurality of through electrodes, wherein one end of the through electrode is connected to an electrode of the logic element 6A, while the other end of the through electrode is connected to an electrode of the memory element 6C. The interposer 6B can be obtained such that the through electrodes are formed in an Si substrate, a resin substrate or a ceramic substrate by using the same composition and manufacturing process as the through electrodes of the circuit substrate.

The memory element 6C has an embedded memory cell connected to the electrode. The memory element 6C may also have a three-dimensional structure in which the memory cell is led to the electrodes based on the TSV technology as in the logic element 6A.

However, the layer number and type of the elements 6A to BC constituting the electronic element 6, the arrangement of their electrodes and so on can vary widely depending on the used electronic element 6, and FIG. 28 merely shows one conceptual example of the three-dimensional multilayer structure.

Basically, the electronic device shown in FIG. 28 has the same effects as the electronic device shown in FIG. 26. In the electronic device of FIG. 28, however, since the three-dimensional multilayer structure is employed to improve the packaging density, the performance and the processing speed and reduce the size, the thickness and the weight, the question of how to dissipate heat generated by the operation becomes a more serious issue.

In the embodiment shown in FIG. 28, there is used the substrate 1 having the columnar heat sinks 3 in the thickness direction of the substrate 1, and the electronic element 6 is disposed in the cavity 11 formed in the substrate. Therefore, heat generated by the operation of the electronic element 6 can be dissipated to the outside of the substrate 1 through the columnar heat sinks 3, thereby avoiding abnormal heat generation due to heat accumulation, keeping the bonding strength between the through electrodes 2 of the substrate 1 and the electrodes of the logic element 6A, the bonding strength between the electrodes of the logic element 6A and the through electrodes of the interposer 6B and the bonding strength between the through electrodes of the interposer 6B and the electrodes of the memory element 6C and maintaining the reliability of electrical connection. Moreover, a variation in electrical characteristics of the logic element 6A and the memory element 6C due to the heat generation can be avoided.

The substrate 1 has the cavity 11 at one side thereof and contains therein the electronic element 6 having a three-dimensional multilayer structure. Many columnar heat sinks 3 each passing through the substrate 1 in the thickness direction are arranged around the cavity 11 to surround the cavity 11 at a small distance from each other. This means that a heat dissipation pathway is formed by the columnar heat sinks 3 to surround the electronic element 6 housed in the cavity 11 as seen in plan, so that heat generated at the electronic element 6 can be collected and dissipated efficiently.

Figure 29:
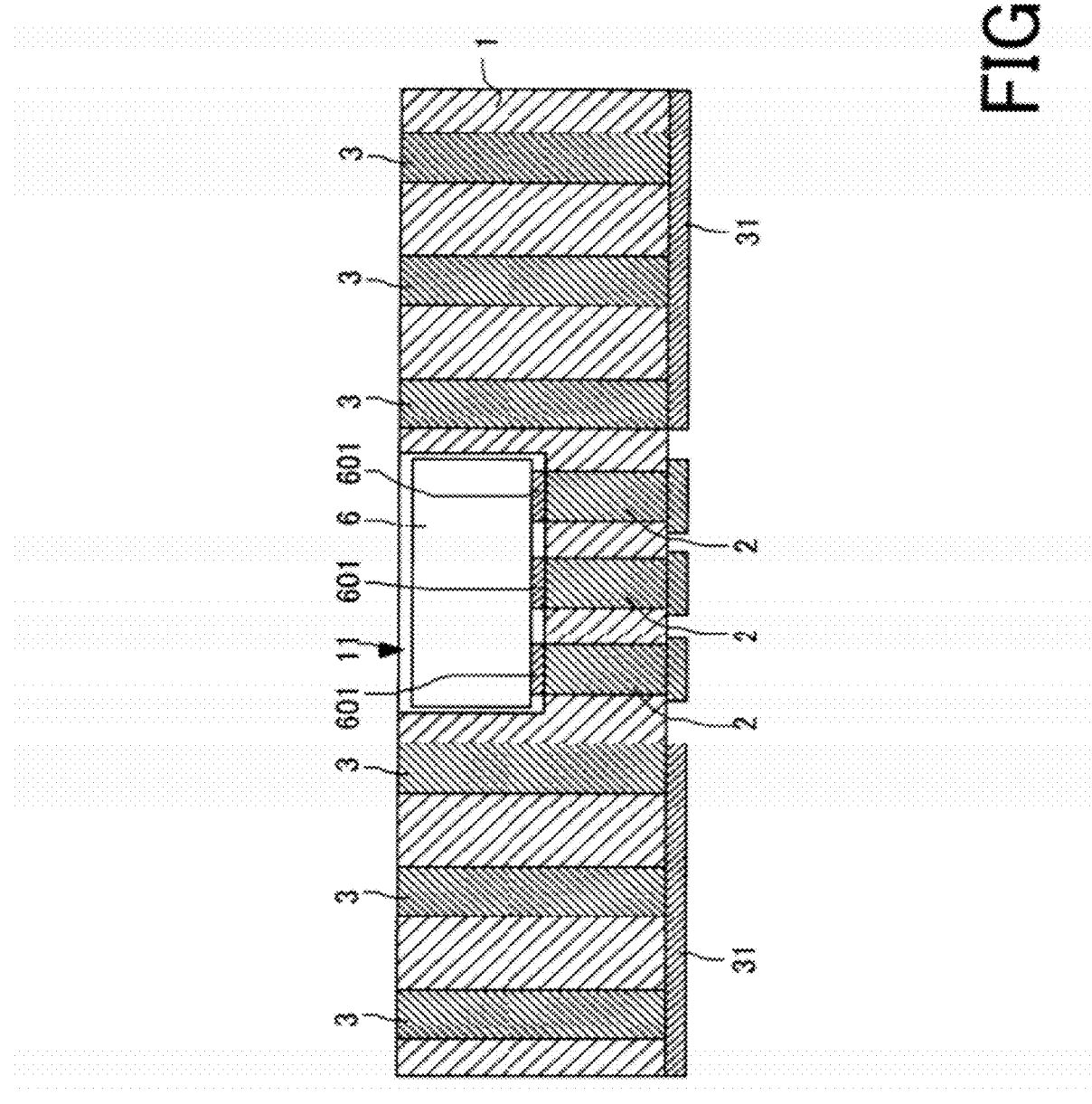
FIG. 29 is a partial sectional view showing another embodiment of an electronic device according to the present invention.

FIG. 29 shows still another electronic device. In this figure, the portions corresponding to the components illustrated in the foregoing figures are denoted by the same reference symbols and duplicate explanations are omitted. In the illustrated electronic device, a plurality of through electrodes 2 each pass through the substrate 1 in the thickness direction within the area of the cavity 11 to have one end exposed on one side within the cavity 11 and the other end exposed on the other side of the substrate 1.

Around the cavity 11, many columnar heat sinks 3 passing through the substrate 1 in the thickness direction are arranged in the form of matrix at a small distance from each other. The columnar heat sinks 3 have first ends (lower ends) connected together through a heat dissipation layer 31 provided on the back surface (second surface) of the substrate 1 and second ends (upper ends) led to the front surface of the substrate 1. The heat dissipation layer 31 is not limited to the illustrated film form but may have a three-dimensional structure having an increased heat dissipation area.

The electronic element 6 is, for example, an active element such as a semiconductor chip, a passive component such as a capacitor or an inductor or a composite element thereof. The electronic element 6 may have a semiconductor element and a passive component in combination or may be a memory element, a logic circuit element or an analog circuit element. These elements may have a single-layer structure or a multilayer structure.

The illustrated electronic element 6 takes the form of a flip chip having a plurality of electrodes 601 on one surface intended to be a mounting surface and is disposed within the cavity 11 of the substrate 1 to have each electrode 601 bonded to one end of the through electrode 2.

The illustrated electronic device includes the substrate 1, and the substrate 1 includes many columnar heat sinks 3. The columnar heat sinks 3 are provided to extend in the thickness direction of the substrate 1. Therefore, heat generated by the operation of the electronic element 6 can be dissipated to the outside of the substrate 1 through the columnar heat sinks 3, keeping the bonding strength at the junction where the electrodes 601 of the electronic element 6 are connected to the through electrodes 2 and maintaining the reliability of electrical connection. Moreover, a variation in electrical characteristics of the electronic element 6 due to the heat generation can be avoided.

The substrate 1 has the cavity 11 at one side thereof and contains therein the electronic element 6. Many columnar heat sinks 3 each passing through the substrate 1 in the thickness direction are arranged around the cavity 11 to surround the cavity 11 at a small distance from each other. This means that a heat dissipation pathway is formed by the columnar heat sinks 3 to three-dimensionally surround the electronic element 6 housed in the cavity 11, so that heat generated at the electronic element 6 can be collected three-dimensionally and dissipated efficiently.

The columnar heat sink 3 passes through the substrate 1 in the thickness direction to have one end led to the second surface of the substrate 1 and connected to the heat dissipation layer 31 provided on the second surface of the substrate 1. With this structure, the heat dissipation characteristics can be further improved.

In the embodiment shown in FIG. 29, the electronic element 6 is fitted in the cavity 11 with a small clearance. With this structure, positioning and setting of the electronic element 6 with respect to the substrate 1 can be performed easily and reliably.

Figure 30:
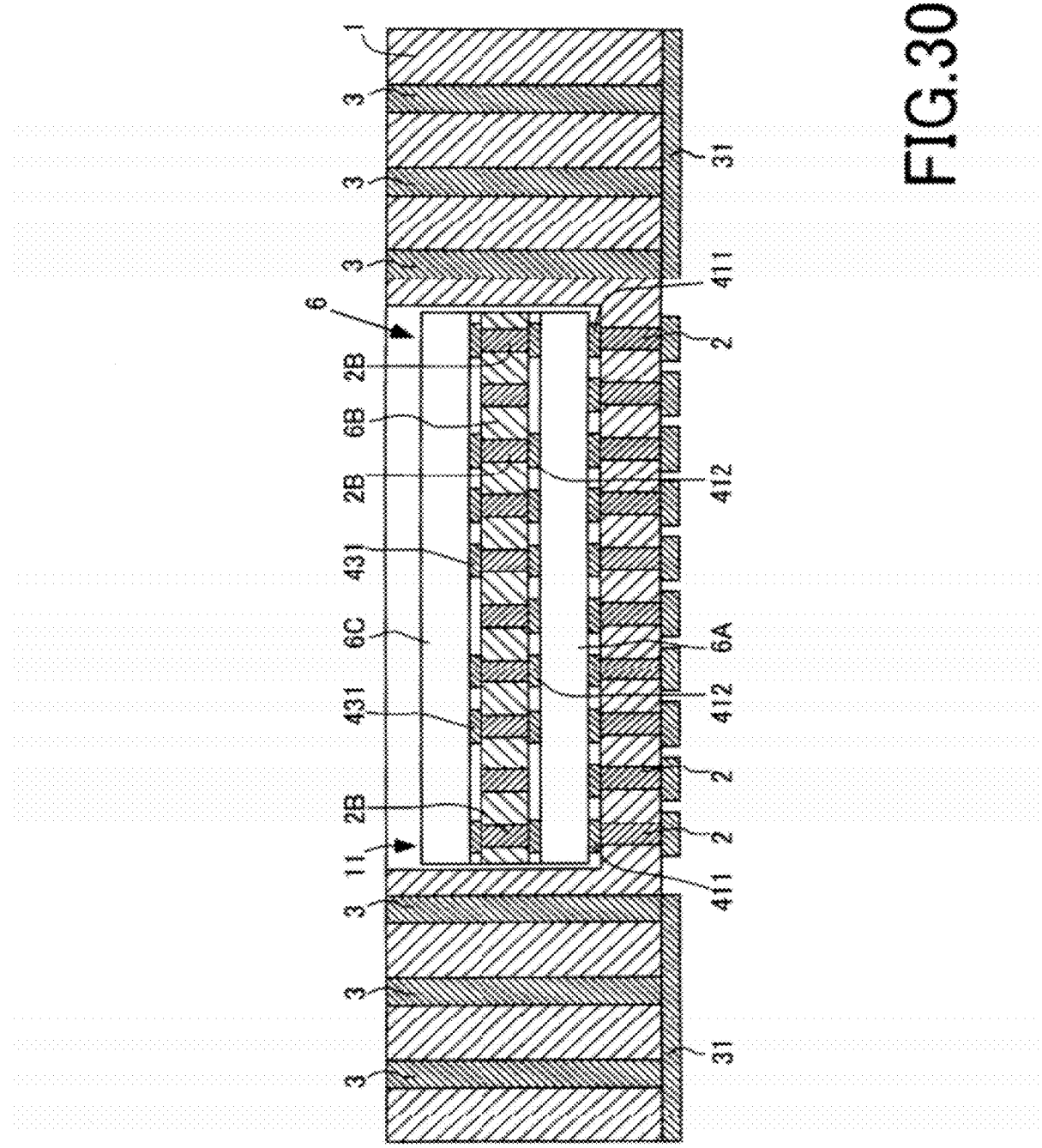
FIG. 30 is a partial sectional view showing another embodiment of an electronic device according to the present invention.

Next description will be made with reference to FIG. 30. In the figure, the portions corresponding to the components illustrated in the foregoing figures are denoted by the same reference symbols and duplicate explanations are omitted. In the figure, the electronic element 6 has a three-dimensional multilayer structure based on the TSV technology, wherein a logic element 6A such as an LSI and a memory element 6C such as a DRAM are stacked and bonded through an interposer 6B. That is, it has a similar structure to that shown in FIG. 28.

The interposer 6B has many through electrodes 2B arranged at a distance from each other, wherein one end of the through electrode 2B is connected to an electrode 412 of the logic element 6A, while the other end of the through electrode 2B is connected to an electrode 431 of the memory element 6C. The interposer 6B can be obtained such that the through electrodes 2B are formed in an Si substrate, a resin substrate or a ceramic substrate by using the same composition and manufacturing process as the through electrodes 2.

The substrate 1 has the cavity 11 at one side thereof and contains therein the electronic element 6 having a three-dimensional multilayer structure. Many columnar heat sinks 3 each passing through the substrate 1 in the thickness direction are arranged around the cavity 11 to surround the cavity 11 at a small distance from each other. This means that a heat dissipation pathway is formed by the columnar heat sinks 3 to three-dimensionally surround the electronic element 6 housed in the cavity 11, so that heat generated at the electronic element 6 can be collected three-dimensionally and dissipated efficiently.

The columnar heat sink 3 passes through the substrate 1 in the thickness direction to have one end led to the second surface of the substrate 1 and connected to the heat dissipation layer 31 provided on the second surface of the substrate 1. With this structure, the heat dissipation characteristics can be further improved.

Embodiment 3

Multilayer Electronic Device

Figure 31:
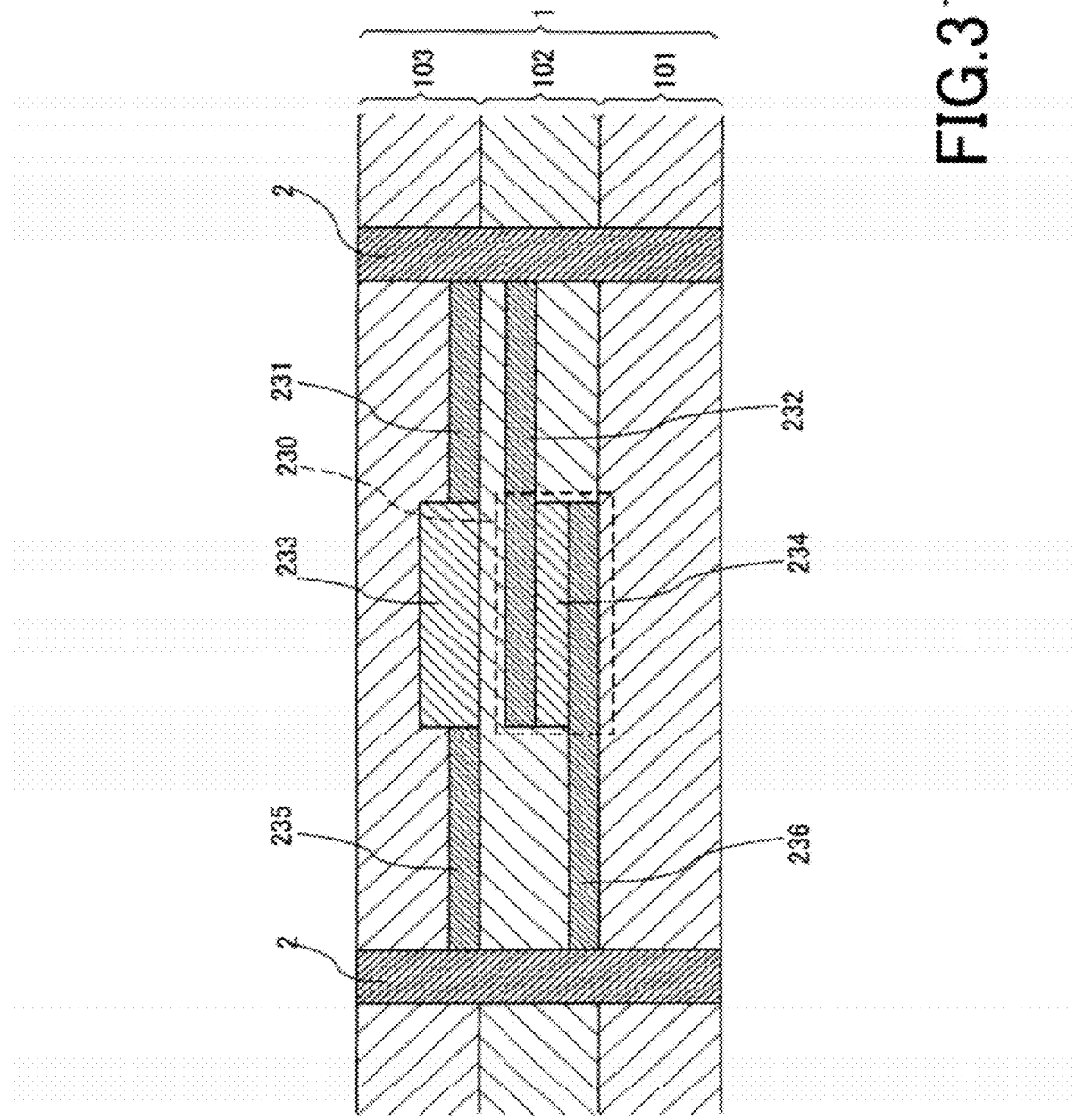
FIG. 31 is a partial sectional view showing another embodiment of an electronic device according to the present invention.

Then, FIG. 31 shows an electronic device 1 comprising a plurality of stacked substrates 101 to 103. In the figure, the lowermost first substrate 101 is an Si substrate, a ceramic substrate, a glass-epoxy substrate or the like and intended to support the other substrates 102, 103. The second substrate 102 is an interposer located between the first substrate 101 and the third substrate 103 and includes a capacitor element 230 such as a decoupling capacitor. The third substrate 103 is an IC chip including an integrated circuit 233 such as an arithmetic element. The second and third substrates 102, 103 may be an Si substrate. It should be noted that since FIG. 31 shows a part of the multilayer structure on an enlarged scale, the IC chip is shown only partially.

The first to third substrates 101 to 103 are stacked with their substrate surfaces in face-to-face contact with each other and include one or more through electrodes 2. The through electrode 2 is a continuous conductor extending across the first to third substrates 101 to 103. More specifically, the through electrode 2 is provided in the first to third substrates 101 to 103 in an embedded state to continuously pass through them in the stacking direction.

In the present embodiment, all the through electrodes 2 continuously pass through the first to third substrates 101 to 103, but it is also possible that some of them pass through only one or two substrates. For example, they may include a through electrode passing through the first and second substrates 101, 102 but not passing through the third substrate 103.

The through electrode 2 is electrically connected to the capacitor element 230 and the integrated circuit 233, individually. The capacitor element 230 comprises a dielectric layer 234, an upper electrode layer 232 and a lower electrode layer 236. With the dielectric layer 234 therebetween, the upper electrode layer 232 and the lower electrode layer 236 are extended and electrically connected to the right and left through electrodes 2 in the figure. The integrated circuit 233 is also electrically connected to the through electrodes 2 with electrodes 231, 235 extending to the right and left through electrodes 2. Such a connecting structure can be adopted when the capacitor element 230 is used as a decoupling capacitor for removing power noise of the integrated circuit 233, for example.

In the electronic device according to the present invention, as described above, the through electrodes 2 being a continuous conductor extending across two or more substrates 101 to 103 are provided with the substrate surfaces of the substrates 101 to 103 in face-to-face contact with each other. That is, the electronic device according to the present invention has a structure in which two or more of substrates 101 to 103 are stacked without using bumps. According to the present invention, therefore, there can be realized a high-quality, highly-reliable electronic device which solves all the problems due to the use of a bump bonding structure, such as difficulty in positioning, guarantee of bonding strength and guarantee of heat resistance.

Figure 32:
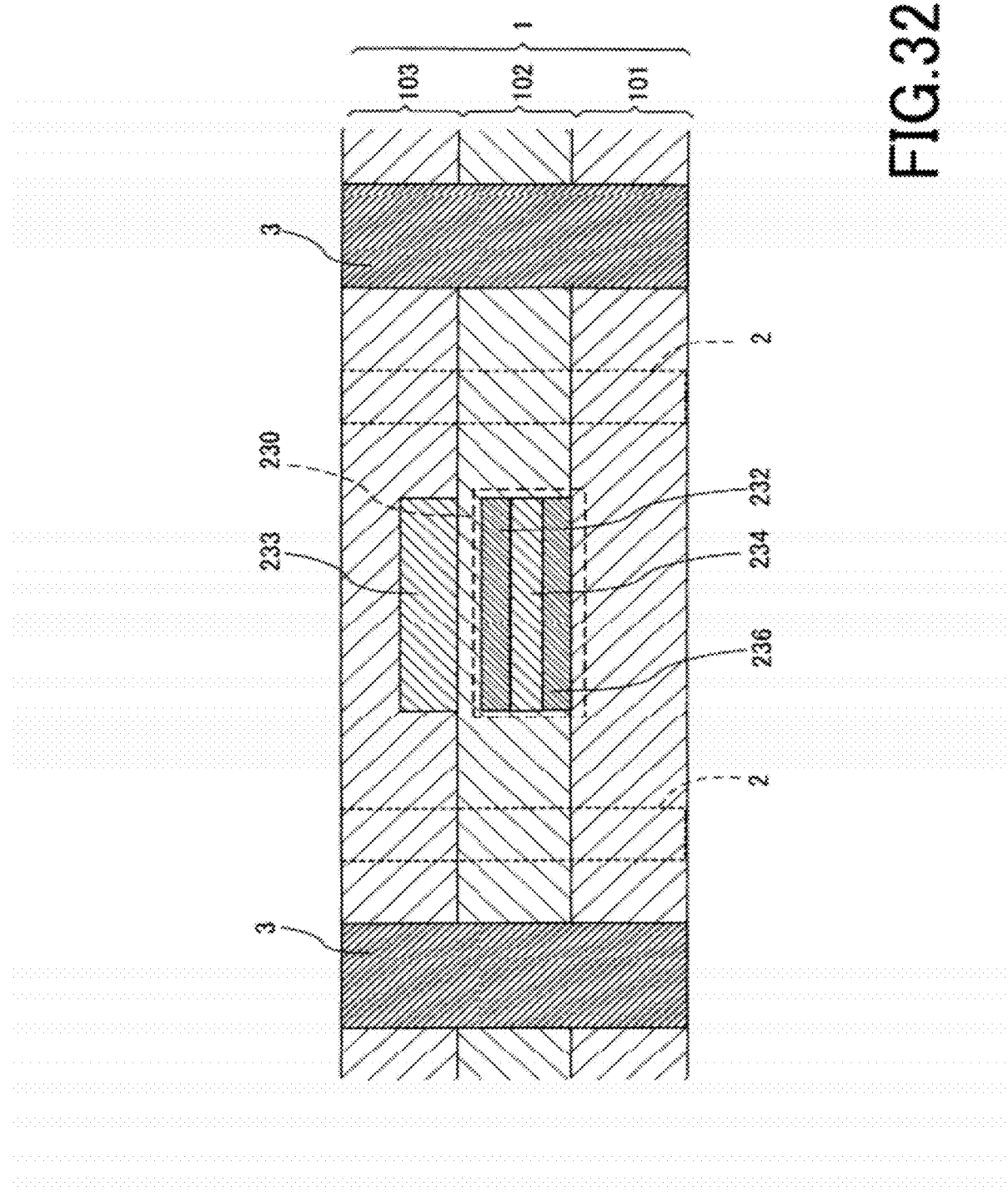
FIG. 32 is a partial sectional view showing another embodiment of an electronic device according to the present invention.

FIG. 32 shows another embodiment. In the embodiment shown in FIG. 32, the columnar heat sinks 3 are provided instead of or along with the through electrodes 2. The columnar heat sinks 3 are arranged around the integrated circuit 233. This means that a heat dissipation pathway is formed by the columnar heat sinks 3 to surround the integrated circuit 233 as the third substrate 103 is seen in plan, so that heat generated at the integrated circuit 233 can be collected and dissipated efficiently. When the integrated circuit 233 is an arithmetic element to be used for a high-heat-generating CPU or the like, the provision of the columnar heat sinks 3 is particularly effective from the viewpoint of ensuring operation stability or the like.

The columnar heat sinks 3 are distributed with a given occupancy rate. By appropriately determining the occupancy rate of the columnar heat sinks 3 in consideration of the thermal resistance of the material constituting the columnar heat sinks 3, accordingly, heat generated by the operation of the integrated circuit 233 can be efficiently dissipated to the outside of the electronic device 1 through the columnar heat sinks 3, thereby avoiding abnormal heat generation.

Since the columnar heat sink 3 is also a continuous body extending across two or more of the plurality of substrates 101 to 103, it makes it possible to solve all the problems that are inevitable when using a bump bonding structure for the columnar heat sinks 3, such as difficulty in positioning, guarantee of bonding-strength and guarantee of heat resistance.

Embodiment 3

Other Devices

Figure 33:
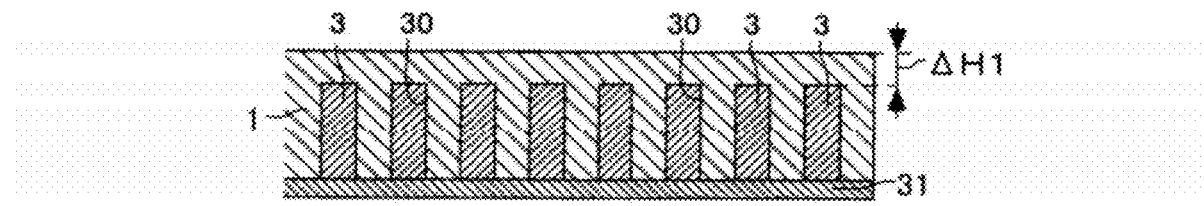
FIG. 33 is a sectional view showing a part of a heat dissipation substrate according to the present invention.

Referring to FIG. 33, there is illustrated a substrate having a number of columnar heat sinks 3. In this substrate 1, the tip of the columnar heat sink 3 is kept within a heat-resistant insulating organic or inorganic substrate 1, thereby leaving an insulating layer having a thickness of $\Delta H1$ above it. That is, the columnar heat sink 3 is not required to pass through it. The thickness of $\Delta H1$ can be determined arbitrarily.

Figure 34:
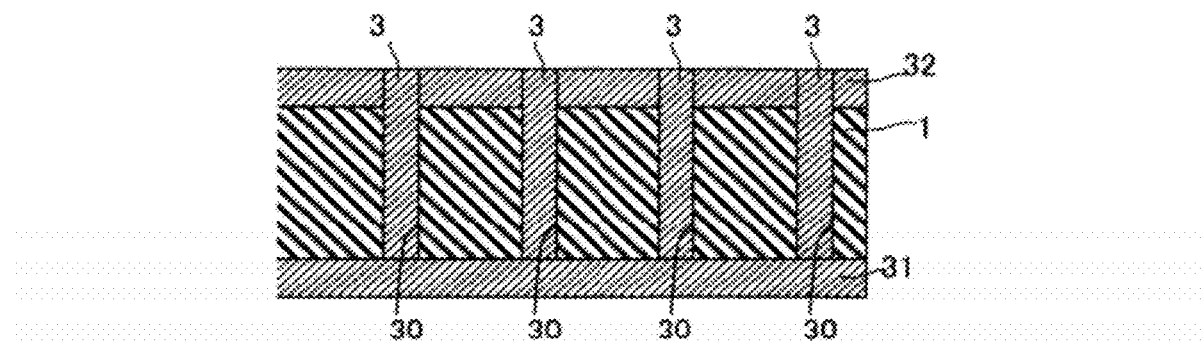
FIG. 34 is a sectional view showing a part of another embodiment of a heat dissipation substrate according to the present invention.

Referring next to FIG. 34, there is illustrated a substrate 1 comprising an organic insulating substrate. The organic substrate 1 preferably comprises a heat-resistant material. Particularly preferred is one having a heat resistance of 300° C. or more. The organic substrate 1 has, on at least one side thereof, a metal layer 31, 32 such as of a Cu foil. The illustrated organic substrate 1 is a double-sided copper-clad substrate having the metal layers 31, 32 of a Cu foil on both sides thereof. Various types of such a double-sided copper-clad substrate are supplied from different board makers and put on the market, for example, under the name of high heat resistance glass-epoxy copper-clad substrate, high heat resistance low thermal expansion glass fabric base material epoxy resin copper-clad substrate, high thermal conductivity glass composite substrate, high heat resistance paper phenol copper-clad substrate, paper base phenolic resin copper-clad substrate and so on.

The use of the organic substrate 1 has advantages that a circuit substrate that has been already put into practical use and commercially available can be utilized, that the material cost for the substrate can be reduced and that the via drilling process for the columnar heat sinks 3 can be performed in short time.

Moreover, since the metal layer 31, 32 is provided on at least one side thereof, the surface of the organic substrate 1 can be prevented from coming into direct contact with and being thermally damaged by a molten metal by feeding the molten metal from the side having the metal layer 31, 32 during a common process including a heat treatment in the columnar heat sink-forming process.

Furthermore, since the metal layer 31, 32 is provided on a plane perpendicular to the columnar heat sinks 3, there is created not only a heat dissipation pathway in the thickness direction because of the columnar heat sinks 3 but also a heat dissipation and diffusion surface perpendicular to the heat dissipation pathway because of the metal layer 31, 32. That is, a three-dimensional heat dissipation pathway can be formed to improve the heat dissipation characteristics.

Figure 35:
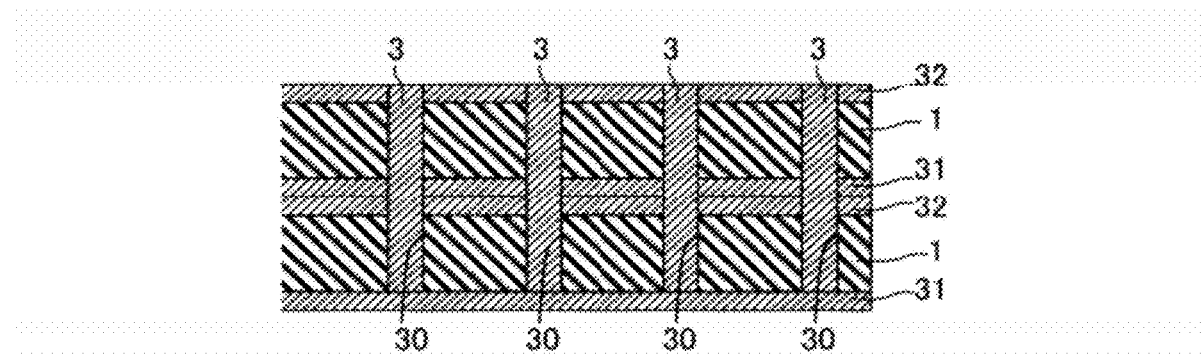
FIG. 35 is a sectional view showing a part of another embodiment of a heat dissipation substrate according to the present invention.

Referring further to FIG. 35, there is illustrated a heat dissipation substrate having a structure in which a plurality of organic substrates 1 having a metal layer 31, 32 on at least one side thereof are stacked with the metal layers 31, 32 located at an interface. The number of organic substrates 1 to be stacked can be determined arbitrarily. Preferably, adjacent organic substrates 1 are bonded together through a bonding material having an excellent heat resistance and thermal conductivity.

In this structure, since the metal layers 31, 32 to be used as a heat dissipation pathway are provided at a middle portion of the stacked organic substrates 1, there is created a three-dimensional heat dissipation structure in which in addition to heat dissipation through the columnar heat sinks 3, heat transferred from the columnar heat sinks 3 can be dispersed in a planar direction at the middle portion of the substrates 1. Thus, heat can be prevented from being accumulated within the substrates 1, thereby suppressing temperature rise of an electronic component to be mounted on the substrates 1. Preferably, the columnar heat sinks 3 are connected to the columnar heat sinks 3 and directly thermally coupled together.

Figure 36:
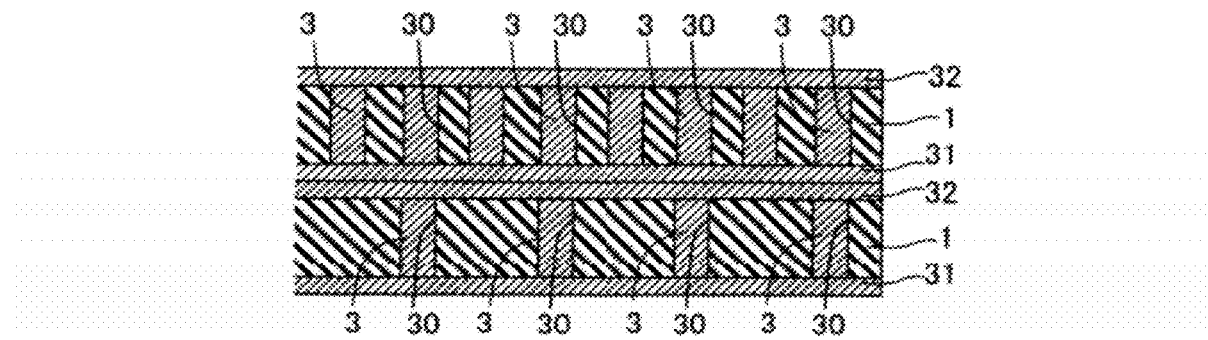
FIG. 36 is a sectional view showing a part of another embodiment of a heat dissipation substrate according to the present invention.
Figure 37:
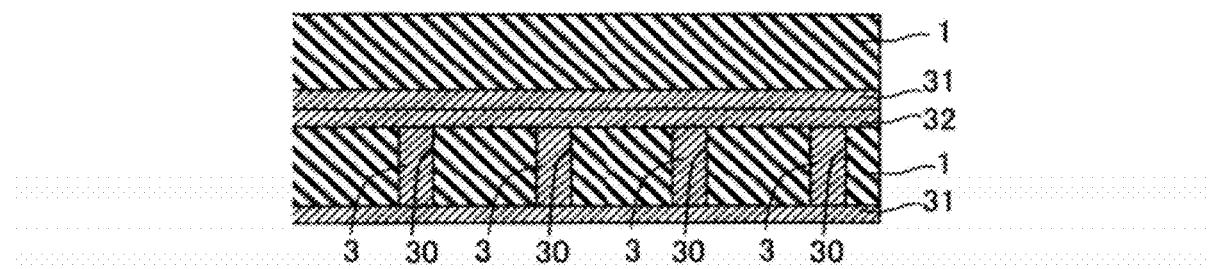
FIG. 37 is a sectional view showing a part of another embodiment of a heat dissipation substrate according to the present invention.
Figure 38:
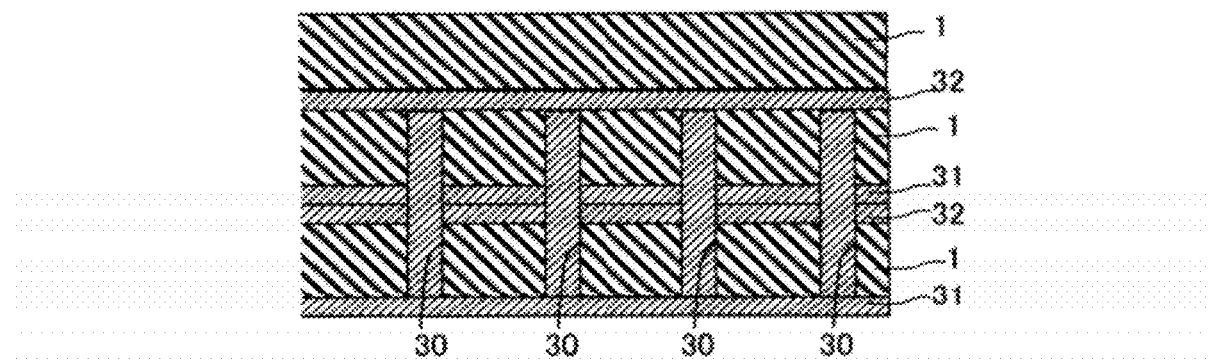
FIG. 38 is a sectional view showing a part of another embodiment of a heat dissipation substrate according to the present invention.

The substrates shown in FIGS. 33 to 35 are useful as a heat dissipation substrate, but they may have various forms in addition to those shown in FIGS. 33 to 35. Such examples are shown in FIGS. 36 to 38. In the figure, the portions corresponding to the components illustrated in FIGS. 33 to 35 are denoted by the same reference symbols and duplicate explanations are omitted. At first, FIG. 36 shows an embodiment in which the columnar heat sinks 3 are arranged at different pitches in two stacked organic substrates 1.

On the other hand, FIG. 37 shows an embodiment in which only one of two stacked organic substrates 1 is provided with the columnar heat sinks 3, while the other is a heat-resistant insulating substrate having no columnar heat sink.

FIG. 38 shows a heat dissipation substrate in which a plurality of organic substrates 1 having the columnar heat sinks 3 along with the metal layers 31, 32 on both sides thereof are stacked, and an organic substrate 1 having no columnar heat sink 3 is further stacked thereon.

Figure 39:
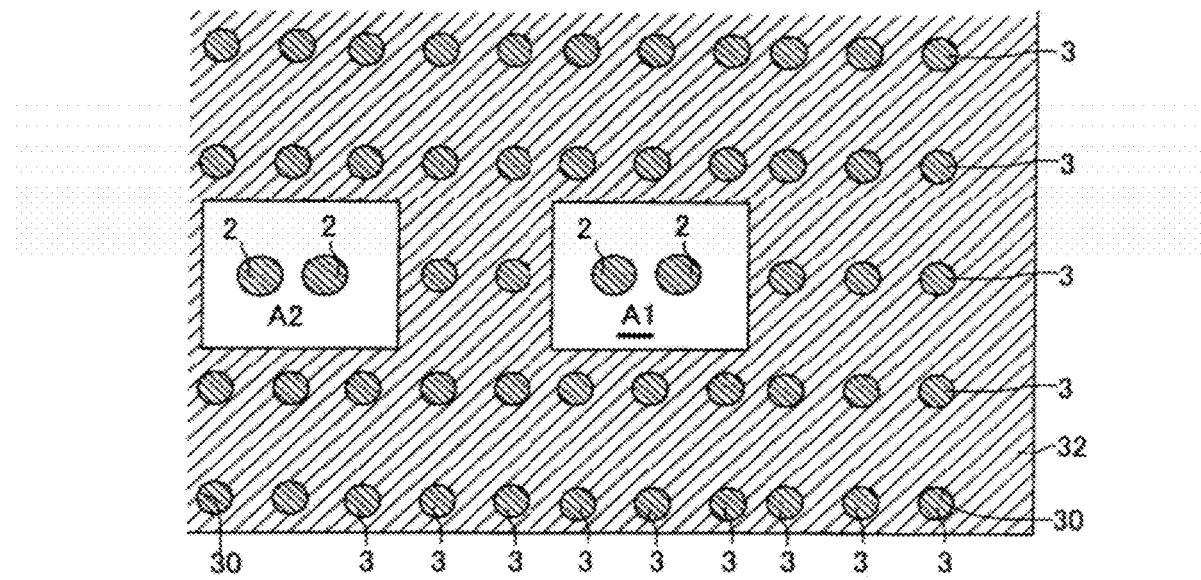
FIG. 39 is a plan view showing a part of another embodiment of a heat dissipation substrate according to the present invention.
Figure 40:
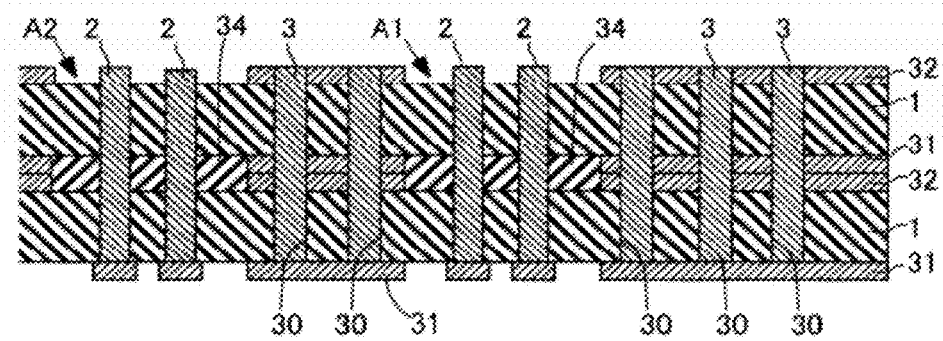
FIG. 40 is a sectional view of the heat dissipation substrate shown in FIG. 39.

The heat dissipation substrate according to the present invention may be used exclusively as a heat dissipation means or may be used as a circuit substrate such as a mother board, a submount board or the like. Referring to FIGS. 39 and 40, a given number (two in the figure) of organic substrates 1 having the metal layers 31, 32 on both sides thereof are stacked, and areas A1, A2 for mounting an electronic component are defined in the bonded organic substrates 1, wherein through electrodes 2 to be exposed within the areas A1, A2 are provided to pass through the two organic substrates 1. The through electrode 2 has a bump on at least one end thereof. The areas A1, A2 and the through electrodes 2 can be designed depending on the type of an electronic component to be mounted.

Figure 41:
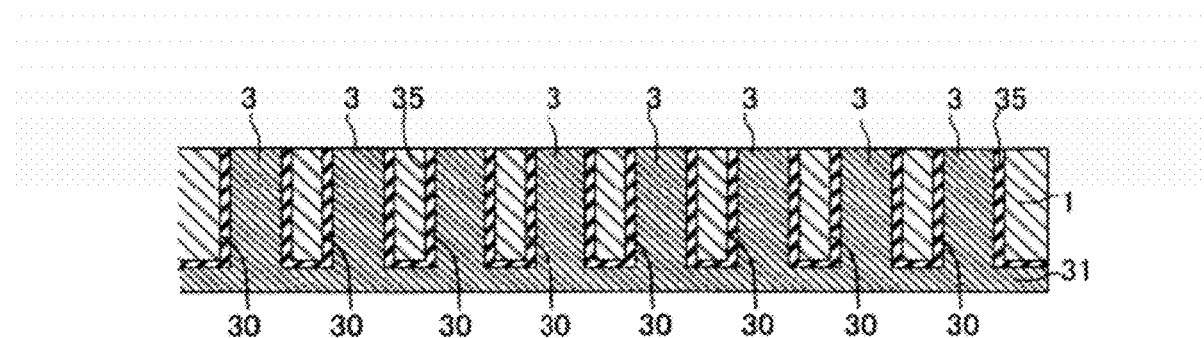
FIG. 41 is a sectional view showing a part of another embodiment of a heat dissipation substrate according to the present invention.
Figure 42:
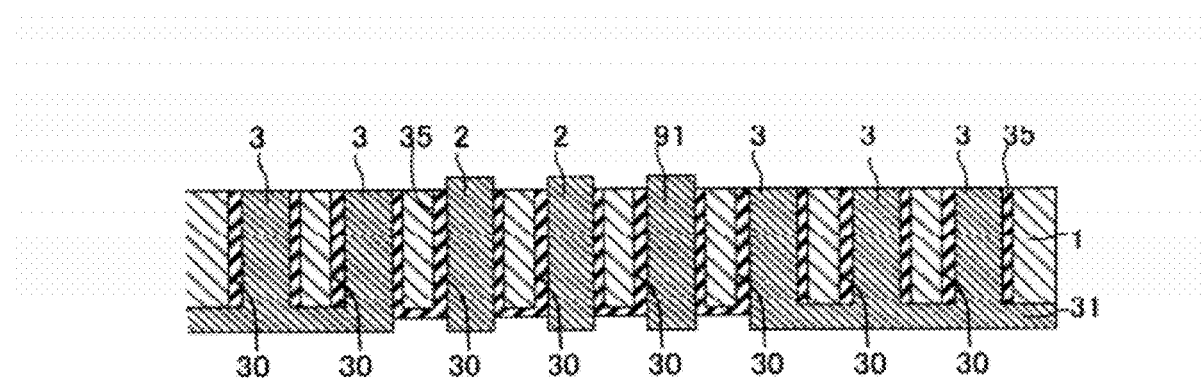
FIG. 42 is a sectional view showing a part of another embodiment of a heat dissipation substrate according to the present invention.

FIGS. 41 and 42 show still another embodiment. Referring first to FIG. 41, the substrate 1 is a conductive substrate, and the columnar heat sinks 3 are electrically insulated from the conductive substrate 1 by an organic or inorganic insulating film 35 formed on an inner wall surface of the via 30 and one surface (lower surface) of the conductive substrate. The conductive substrate 1 may be a metal plate or an Si substrate.

Referring next to FIG. 42, the through electrodes 2 are provided in addition to the columnar heat sinks 3. The through electrodes 2 are electrically insulated from the conductive substrate 1 by the insulating film 35.

As described above, the electronic device according to the present invention may be almost any electrical product based on the technology of the electronics and its specific examples include a vehicle-mounted electronic device. Examples of the vehicle-mounted electronic device include a motor drive inverter to be mounted on a hybrid vehicle or an electric vehicle, a large-scale integration device (LSI) for LED lamp control and so on. Their specific examples will be described below.

Figure 43:
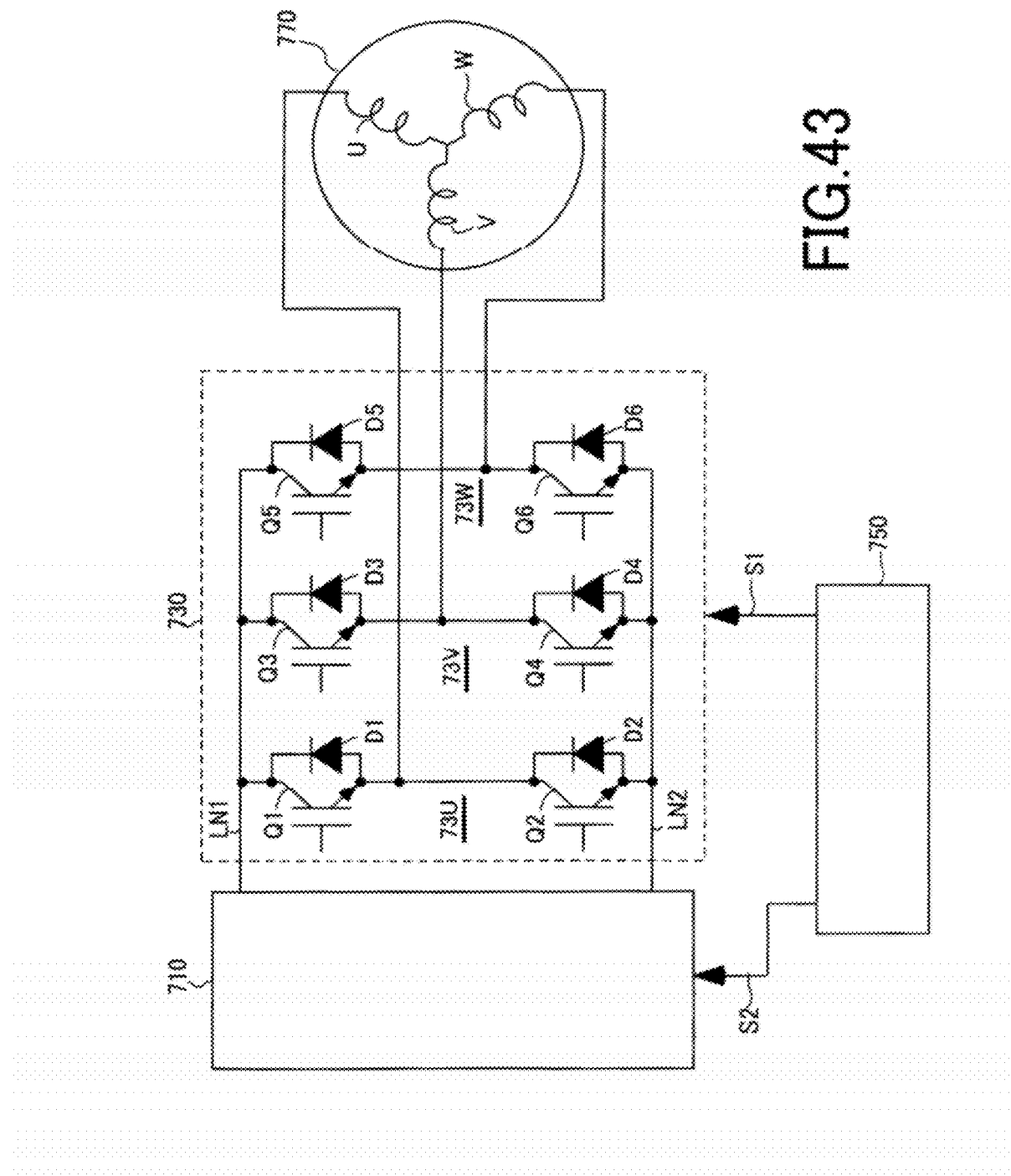
FIG. 43 is a circuit diagram of a vehicle-mounted electronic device.

FIG. 43 is a circuit diagram of a motor driver unit including a motor drive inverter. Referring to FIG. 43, the motor driver unit comprises a DC power supply 710, an inverter 730 and a controller 750 and is designed to drive a motor (or generator) 770 being a three-phase AC rotating electrical machine. The DC power supply 710 comprises, for example, a secondary cell such as a nickel-metal hydride cell or a lithium-ion cell, a capacitor, a condenser or a fuel cell.

The inverter 730 comprises a U-phase arm 73U, a V-phase, arm 73V and a W-phase arm 73W. The U-phase arm 73U comprises switching elements Q1, Q2 connected in series, the V-phase arm 73V comprises switching elements Q3, Q4 connected in series and the W-phase arm 73W comprises switching elements Q5, Q6 connected in series. Furthermore, diodes D1 to D6 for passing a current from the side of an emitter to the side of a collector are connected between the collector and the emitter of the switching elements Q1 to Q6, respectively.

At a midpoint, each phase arm is connected to a phase terminal of each phase coil U, V, W of the motor 770. That is, the motor 770 is constructed by commonly connecting one ends of U, V, W-phase three coils to its neutral point, while the other end of the U-phase coil is connected to a midpoint between the switching elements Q1, Q2, the other end of the V-phase coil is connected to a midpoint between the switching elements Q3, Q4 and the other end of the W-phase coil is connected to a midpoint between the switching elements Q5, Q6.

The inverter 730 converts a direct current voltage supplied from the DC power supply 710 to an alternating current voltage based on a signal S1 from the controller 750 and drives the motor 770 with the alternating current voltage. Thus, the motor 770 can be driven to generate a torque in accordance with a torque command value.

Figure 44:
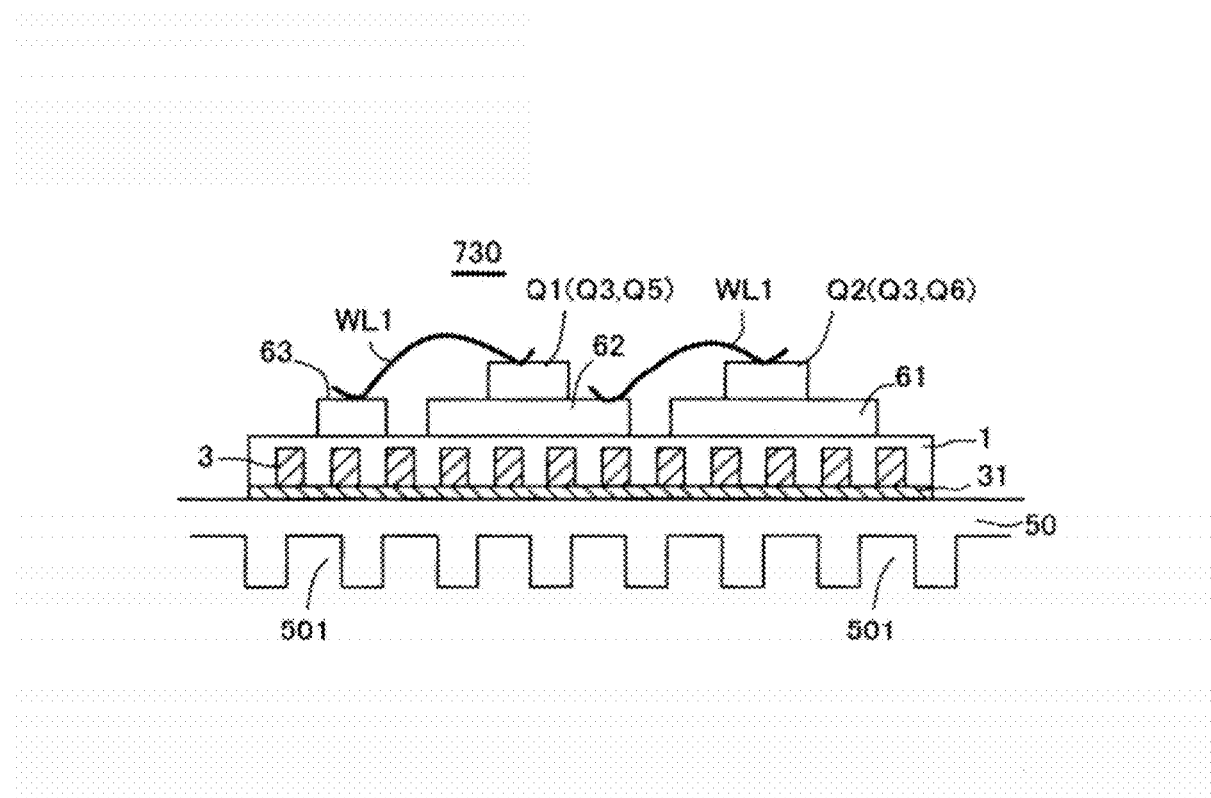
FIG. 44 is a partial sectional view showing a heat dissipation structure of the vehicle-mounted electronic device shown in FIG. 43.

FIG. 44 is a drawing showing a mounted state of the switching element being a component of the inverter of the motor driver unit shown in FIG. 43. The inverter 730 is mounted on one side of a heat dissipation substrate 1 according to the present invention. The U-phase arm 73U of the inverter 730 comprises the switching elements Q1, Q2, a P-electrode layer 63, an intermediate electrode layer 62 and an N-electrode layer 61. Since the V-phase arm 73V and the W-phase arm 73W have a similar structure, the following description will be made mainly for the U-phase arm 73U.

The U-phase arm 73U comprises the switching elements Q1, Q2, the P-electrode layer 63, the intermediate electrode layer 62 and the N-electrode layer 61 and is mounted on one side of the heat dissipation substrate 1 according to the present invention.

The P-electrode layer 63, the intermediate electrode layer 62 and the N-electrode layer 61 are all formed on the heat dissipation substrate 1 by patterning. One end of the P-electrode layer 63 is connected to a busbar forming a power-supply line LN1. One end of the N-electrode layer 61 is connected to a busbar forming a ground line LN2. The intermediate electrode layer 62 corresponds to the midpoint of the U-phase arm 73U in FIG. 43. Although not illustrated, the busbars are also disposed on one side of the heat dissipation substrate 1.

The switching element Q1 is adhered to the intermediate electrode layer 62 to bring the collector into conduction with the intermediate electrode layer 62. The emitter of the switching element Q1 is connected to the P-electrode layer 63 through a wire WL1.

The switching element Q2 is adhered to the N-electrode layer 61 to bring the collector into conduction with the N-electrode layer 61. The emitter of the switching element Q2 is connected to the intermediate electrode layer 62 through a wire WL1.

The heat dissipation substrate 1 is of the type having an insulating layer on one side (upper side) where the switching elements Q1, Q2, the P-electrode layer 63, the intermediate electrode layer 62 and the N-electrode layer 61 are to be mounted, while the metal layer 31 on the lower side is put on a heat dissipation block 50 through a silicone grease.

The heat dissipation block 50 has a plurality of grooves 501. When a water cooling system is used as a cooling system of the inverter 730, cooling water supplied from an external radiator (not shown) flows down the plurality of grooves 501 of the heat dissipation block 50 in a direction perpendicular to the plane of paper, thereby cooling the switching elements Q1, Q2 through the heat dissipation substrate 1. The switching elements Q3 to Q6 have the same cooling system.

In a hybrid vehicle or an electric vehicle, since the motor 770 is driven by converting a direct current voltage supplied from the DC power supply 710 to an alternating current voltage using the inverter 730, a large current flows through the switching elements Q1 to Q6 and the busbars constituting the inverter 730. Thus, the question of how to cool such a heat-generating part becomes a major issue.

In addition to the electrical insulation to the switching elements Q1, Q2, the P-electrode layer 63, the intermediate electrode layer 62, the N-electrode layer 61 and so on, the heat dissipation substrate 1 according to the present invention has a heat dissipation pathway formed by the columnar heat sinks 3, whereby heat of the switching elements Q1 to Q6 and the busbars constituting the inverter 730 can be efficiently transferred to the heat dissipation block 50, contributing to cooling of the switching elements Q1 to Q6, the busbars and so on.

Figure 45:
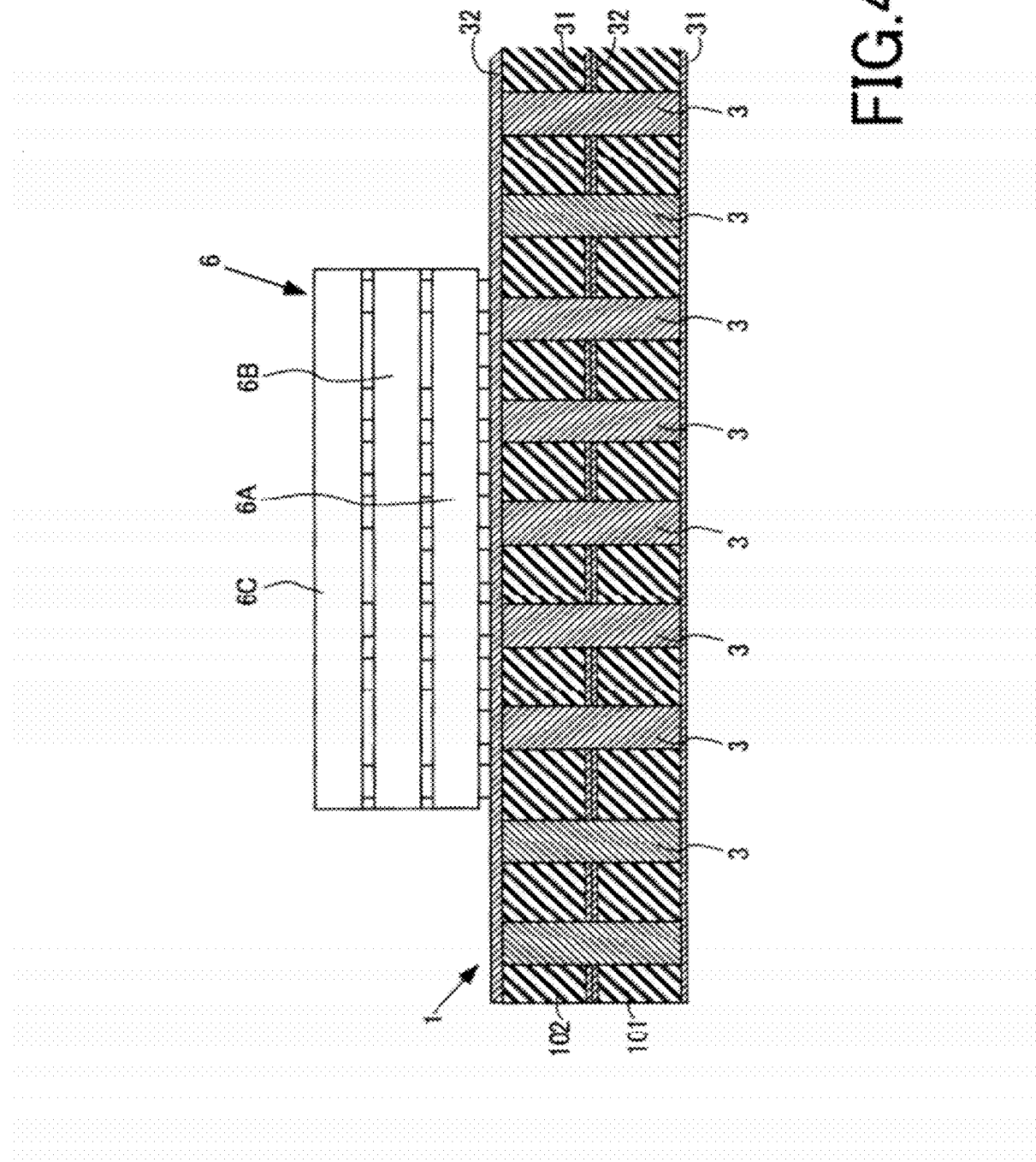
FIG. 45 is a partial sectional view showing a heat dissipation structure that can be employed for an electronic device such as a personal computer or a mobile phone.

Next will be described an embodiment in which the heat dissipation substrate according to the present invention is used for a personal computer, a mobile phone, a digital appliance or the like by referring to FIGS. 45 and 46. Referring first to FIG. 45, an electronic component 6 is mounted on one side of the heat dissipation substrate 1 according to the present invention.

The electronic component 6 is constructed by stacking and bonding a logic element 6A such as an LSI and a memory element 6C such as a DRAM through an interposer 6B. Electronic devices of this type can be used as a basic element of an information processing system. More specifically, they can be used as a component of an image processing system in a personal digital assistant, a mobile phone, a digital appliance, a server or the like. There are other uses, including an image sensor module.

The logic element 6A is in the form of a chip containing a semiconductor logic circuit such as an LSI. The interposer 6B has a decoupling capacitor and a through electrode, wherein one end of the through electrode is connected to the logic element 6A, while the other end of the through electrode is connected to the memory element 6C. This makes it possible to obtain an electronic component having a three-dimensional structure based on the TSV technology. The interposer 6B can be obtained by forming the through electrode in an Si substrate, a resin substrate or a ceramic substrate. However, the layer number and type of the elements constituting the electronic component 6, the arrangement of their electrodes and so on can vary widely depending on the used electronic component 6, and FIG. 45 merely shows one conceptual example of the three-dimensional multilayer structure.

In this structure, since the metal layers 31, 32 to be used as a heat dissipation pathway are provided at a middle portion of the stacked organic substrates 101, 102, there is created a three-dimensional heat dissipation structure in which in addition to heat dissipation through the columnar heat sinks 3, heat transferred from the columnar heat sinks 3 can be dispersed in a planar direction at the middle portion of the substrates 1. Thus, heat can be prevented from being accumulated within the substrates 1, thereby suppressing temperature rise of the electronic component 6 to be mounted on the substrates 1.

Although not illustrated, the logic element 6A, the interposer 6B and the memory element 6C can also contain similar columnar heat sinks, wherein heat dissipation effect can be further improved by connecting the columnar heat sinks continuously and thermally coupling them to the columnar heat sinks 3 of the mother board 1.

Figure 46:
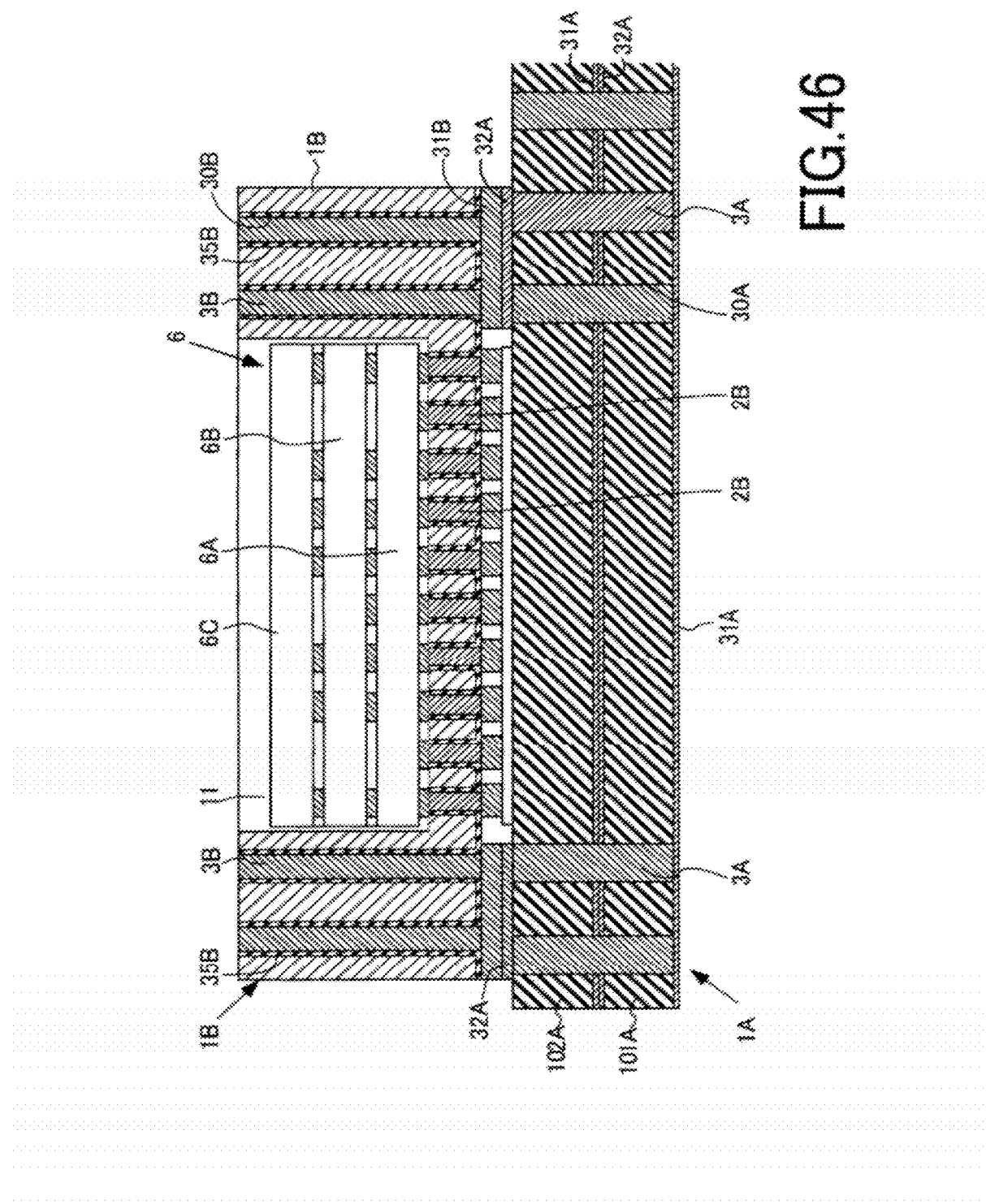
FIG. 46 is a partial sectional view showing a heat dissipation structure that can be employed for an electronic device such as a personal computer or a mobile phone.

Referring next to FIG. 46, there is illustrated an embodiment in which a submount board 1B containing the electronic component 6 is mounted on one side of a mother board 1A. The mother board 1A is similar to that shown in FIG. 19 and has a structure in which two organic substrates 101A, 102A having metal layers 31A, 32A on two sides thereof are stacked with the metal layers 31A, 32A located at an interface.

In the submount board 1B, there are disposed not only columnar heat sinks 3B but also through electrodes 2B. The submount board 1B has a cavity 11 at one side thereof, and the columnar heat sinks 3B electrically insulated by an insulating layer 35B are provided in a thick portion around the cavity 11. One end of the columnar heat sink 3B is connected to a metal layer 31B. The through electrodes 2B are provided at the bottom of the cavity 11 and electrically insulated by the insulating layer 35B.

The electronic component 6 is housed in the cavity 11, and electrodes (bumps) provided on the lower surface of the logic element 6A are connected to one ends of the through electrodes 2B.

In the case of FIGS. 45 and 46, since the columnar heat sinks 3A, 3B are provided in the mother board 1A and the submount board 1B, heat generated by the operation of the electronic component 6 can be transferred from the submount board 1B to the mother board 1A through the columnar heat sinks 3A, 3B and dissipated to the outside. Accordingly, abnormal heat generation due to heat accumulation can be prevented to avoid a variation in electrical characteristics of the electronic component 6 due to the heat generation.

The submount board 1B has the cavity 11 at one side thereof and contains therein the electronic component 6. Many columnar heat sinks 3B each passing through the submount board 1B in the thickness direction are arranged around the cavity 11 at a small distance from each other. This means that a heat dissipation pathway is formed by the columnar heat sinks 3B to three-dimensionally surround the electronic component 6 housed in the cavity 11, so that heat generated at the electronic component 6 can be, collected three-dimensionally and dissipated efficiently.

While the present invention has been particularly shown and described with respect to preferred embodiments thereof, it will be understood by those skilled in the art that various changes in form and detail may be made therein without departing from the spirit, scope and teaching of the invention.

What is claimed is:

1. A substrate for an electronic device, the substrate having a first side and a second side opposite to the first side, the substrate comprising: a first via passing through from the first side to the second side of the substrate; a through electrode formed in the first via; a second via passing through from the first side to the second side of the substrate; a heat sink formed in the second via; a recess formed on the first side, wherein the recess includes a bottom wall and side walls, wherein a top surface of the through electrode reaches to the bottom wall of the recess, wherein the recess is capable of mounting an electronic component thereon, and a reflection film provided on the side walls of the recess, wherein the reflection film is one of an Al film, an Ag film or a Cr film; wherein the through electrode and the heat sink have a nanocomposite structure consisting of a nm-sized carbon nanotube and a metal/alloy component having a nanocomposite crystal structure, the metal/alloy component including Cu, wherein the through electrode and the heat sink have a compact structure free from any cavity, void or hollow and kept in close contact with a side wall surface of each of the first via and the second via, wherein the through electrode and the heat sink are made by casting a liquid state of a mixture consisting of the metal/alloy component and the nm-sized carbon nanotube into the first via and the second via, followed by solidifying the mixture to form the through electrode and the heat sink.

2. The substrate of claim 1, including at least one of an inorganic substrate, an organic substrate and a semiconductor substrate.

3. The substrate of claim 2, wherein the through electrode is electrically insulated from the substrate by an electrical insulating film or electrical insulating layer.

4. The substrate of claim 1, wherein the heat sink is electrically insulated from the substrate by an electrical insulating film or electrical insulating layer.

5. The substrate for the electronic device according to claim 1, wherein the electronic component is mounted on the bottom wall of the recess of the substrate.

* * * * *